US006665479B2

(12) United States Patent
Gharavi

(10) Patent No.: US 6,665,479 B2
(45) Date of Patent: Dec. 16, 2003

(54) POLYMERIC DEVICES INCLUDING OPTICAL WAVEGUIDE LASER AND OPTICAL AMPLIFIER

(75) Inventor: Alireza Gharavi, Chicago, IL (US)

(73) Assignee: Shayda Technologies, Inc., Chicago, IL (US)

( * ) Notice: Subject to any disclaimer, the term of this patent is extended or adjusted under 35 U.S.C. 154(b) by 140 days.

(21) Appl. No.: 09/801,112

(22) Filed: Mar. 6, 2001

(65) Prior Publication Data

US 2002/0009274 A1 Jan. 24, 2002

Related U.S. Application Data

(60) Provisional application No. 60/187,279, filed on Mar. 6, 2000.

(51) Int. Cl.[7] ................................................. G02B 6/00
(52) U.S. Cl. ........................... 385/122; 385/10; 385/147
(58) Field of Search ................................ 385/122–129, 385/147, 10, 39, 50, 53

(56) References Cited

U.S. PATENT DOCUMENTS

| 4,720,355 | A  | 1/1988  | DeMartino |
| 5,106,211 | A  | 4/1992  | Chiang et al. |
| 5,247,190 | A  | 9/1993  | Friend et al. |
| 5,581,642 | A  | 12/1996 | Deacon et al. |
| 5,663,790 | A  | 9/1997  | Ekström et al. |
| 5,917,980 | A  | 6/1999  | Yoshimura et al. |
| 6,111,902 | A  | 8/2000  | Kozlov et al. |
| 6,204,514 | B1 | 3/2001  | Koshihara et al. |
| 6,456,636 | B1 | 9/2002  | Koshihara et al. |

FOREIGN PATENT DOCUMENTS

| EP | 0 380 139    | 1/1990  |
| EP | 0 593 081    | 4/1994  |
| EP | 0 689 067    | 12/1995 |
| EP | 0 778 479    | 6/1997  |
| EP | 0 792 089    | 8/1997  |
| WO | WO 00/76008  | 12/2000 |
| WO | WO 00/76009  | 12/2000 |
| WO | WO 01/06240  | 1/2001  |
| WO | WO 01/06305  | 1/2001  |

OTHER PUBLICATIONS

Bauer et al., "*A Surface–Emitting Circular Grating Polymer Laser*", Adv. Mater., 13 (15), 1161–1164 (2001).

Kallinger et al., "*A Flexible Conjugated Polymer Laser*", Adv. Mater., 10 (12), 920–923 (1998).

McGehee et al., "*Semiconducting (Conjugated) Polymers as Materials for Solid–State Lasers*", Adv. Mater., 12 (22), 1655–1668 (2000).

Tessler, "*Lasers Based on Semiconducting Organic Materials*", Adv. Mater., 11 (5), 363–370 (1999).

(List continued on next page.)

*Primary Examiner*—Akm Enayet Ullah
(74) *Attorney, Agent, or Firm*—Marshall, Gerstein & Borun LLP

(57) ABSTRACT

The present invention provides a family of novel polymeric devices including an optical laser and optical amplifier, as well as novel methods and materials for their manufacture. The devices of the invention preferably each comprise optical nonlinear second-order polymers (including polymer blends) which exhibit electroluminescence. The devices can be present in a single layer (e.g., either singly, or in an array including a side-by-side arrangement), and optionally comprise a plurality of layers, such as at least two layers, preferably which are stacked (e.g., either a stack of single devices, or a stack of arrayed devices). The devices of the invention optionally can be fabricated attached to other devices (optical or non-optical) or elements of devices (e.g., electrodes and the like).

23 Claims, 10 Drawing Sheets

OTHER PUBLICATIONS

Theander et al., "Lasing in a Microcavity with an Oriented Liquid–Crystalline Polyfluorene Copolymer as Active Layer", Adv. Mater., 13 (5), 323–327 (2001).

Miller et al., "Substituted Azole Derivatives as Nonlinear Optical Chromophores", Chem. Mater, 6, 1023–1032 (1994).

Yu et al., "Novel Second–Order Nonlinear Optical Polyimides", SPIE, 2527, 127–136 (1995).

Yu et al., "Design and Synthesis of Functional Polyimides for Second–Order Nonlinear Optics", Macromolecules, 27 (23), 6718–6721 (1994).

Yu et al., "A Generic Approach to Functionalizing Aromatic Polyimides for Second–Order Nonlinear Optics", Macromolecules, 28 (3), 784–786 (1995).

Yu et al., "Novel Second–Order Nonlinear Optical, Aromatic, and Aliphatic Polyimides Exhibiting High–Temperature Stability", Appl. Phys. Lett., 66(9), 1050–1052 (1995).

POLYMERIC DEVICES INCLUDING OPTICAL WAVEGUIDE LASER AND OPTICAL AMPLIFIER

CROSS REFERENCE TO RELATED APPLICATIONS

This application claims the benefit of provisional U.S. patent application serial No. 60/187,279 filed Mar. 6, 2000.

GOVERNMENT RIGHTS IN THE INVENTION

The invention was made with Government support under Agreement No. DAS G60-00-M-0113, awarded May 11, 2000 by the U.S. Army Space and Missile Defense Command, U.S. Department of Defense to Alireza Gharavi of Shayda Technologies, for a project entitled "Mid-Infrared Stacked Waveguide Laser Arrays with Organic Light Emitting Diodes." Accordingly, the government may have certain rights in the invention.

TECHNICAL FIELD OF THE INVENTION

The present invention pertains novel polymeric devices that can be employed inter alia as optical lasers or optical amplifiers. The invention further provides novel methods of manufacturing the devices, and novel materials for such manufacture. The devices optionally can comprise a single layer, and alternately, preferably include a plurality of layers which each comprise one or more laser(s) and/or amplifier(s) comprised of optical nonlinear second-order polymers (including polymer blends) which exhibit electroluminescence.

BACKGROUND OF THE INVENTION

As the demand for internet access grows exponentially, the demand for cheaper components increases accordingly. The rise in demand is driving the industry and technology towards an "all optical" solution. One of the untapped areas is the use of advanced optical polymers and organic material to produce cheaper components (Montgomery et al., "Higher bandwidth demands lower fiber-optic component costs", *Lightwave*, 100 (February 1999)). An example of a potentially large market for this technology is the transmission of optical signals directly into the homes of internet clients. The problems and cost associated with bringing glass fiber to desktops makes it uneconomical to do so at this time. The materials with the most promise for this purpose are polymer optical fibers and polymer-based components which can be mass produced cheaply and handled easily. Many such components have been developed and are being considered for use in the optical communications industry.

Polymer light-emitting diodes which were a mere curiosity up until the early 90s are now a market reality for display technologies (see, e.g., Lieberman, "Organic LEDs ramp for low-cost displays", *Electronic Engineering Times*, 59 (Mar. 29, 1999); Jabbour et al., "Aluminum composite cathodes", *Optics and Photonics News*, 24–27 (April 1999)). At the same time, nonlinear optical polymers are being investigated (e.g., as described in PCT International Applications WO 01/06305 and WO 01/06240) to develop optical integrated circuits (OICs) made of polymers (Jenekhe et al., Eds., ACS Symposium Series 672, "Photonics and Optoelectronic Polymers", (1997)). To fulfill this objective, other necessary components are organic laser sources, amplifiers, and detectors, to name but a few.

In general, all integrated optical circuits introduce a signal loss. One of the main criticisms of polymer waveguides and components is their inherent higher optical loss in comparison with their silicon/germanium based counterparts, which means that the former require more frequent amplification of the signals. Accordingly, there is a need for an integrated optical amplifier that makes optical amplification possible within OICs. Furthermore, the demand for bandwidth is driving service to put as many as 80 channels in the range of the erbium C-band fiber amplifier. Future deployments may exceed 256 channels, which will require wider bandwidth optical amplifiers.

Erbium-doped fiber amplifiers (EDFAs) are considered the enabling technology for both long haul telecommunications and metropolitan networks (Chua et al., "Micro-optic integrated components improve optical amplifiers", *Lightwave*, 78 (February 1999)). However these EDFAs have a range that covers the fiber's third transmission window at 1550 nm (C-band). Optical signal amplification currently is solely based on erbium-doped fibers where erbium is the active element with emissions in the 1.5 $\mu$m range with a 35 nm window (1528–1563 nm). This window is particularly popular in the telecommunication industry for long distance transmissions because of the use of EDFAs. Consequently, all long haul telecommunication transmissions are densely squeezed into closely-spaced channels within this band which causes cross-talk problems. Meanwhile there are three more untapped bands available in optical fiber at 1.3 $\mu$m, 1.45 $\mu$m, and 1.6 $\mu$m. The present lack of suitable amplifiers for these bands renders them unusable for long distance communications for the time being. Alternative active materials are thus necessary to break away from this limitation and provide amplification over the whole range of the available channels.

Currently the research activity in the organic light emitting diode (OLED) area is targeting the "optical display" market. During the past decade there has been tremendous progress in this field and products such as OLED displays have begun to reach the market with brightness and efficiency that exceed those of current liquid crystal displays (LCDs). This technology is expected to win a significant share of the display market. Another less visible effort which is growing at a steady pace is the development of advanced polymeric material for nonlinear optics and opto-electronics. Like inorganic silicon-based opto-electronics, the organic-based opto-electronics are capable of producing the necessary components that enable it to enter the race for integrated optical circuitry. Basic components such as optical waveguides, modulators, optical switches, splitters, and the like already have been manufactured with some success. Other critical components such as organic laser sources, optical amplifiers and detectors will need to be developed further.

Thus, the present invention attempts to meet some of these needs in the industry by providing, among other things an optical laser, and an optical amplifier, preferably with organic light emitting diodes. The optical devices according to the invention conceivably can be manufactured easily due to novel means for their production and their novel use of materials, as further described herein. Furthermore, the laser and optical amplifier can be constructed in arrays, and optionally can be stacked (e.g., when present individually, or in arrays, etc.). Uses of the devices include but are not limited to communication and information systems, optical switching, computing, and display panels. The devices described herein should facilitate deployment of all-optical communications networks. These and other objects and advantages of the present invention, as well as additional inventive features, will be apparent from the following description of the invention provided herein.

BRIEF SUMMARY OF THE INVENTION

The present invention pertains to a family of novel polymeric devices including an optical laser and optical amplifier, and to novel methods and materials for their manufacture. The devices of the invention preferably each comprise optical nonlinear second-order polymers (including polymer blends) which exhibit electroluminescence. The devices can be present in a single layer (e.g., either singly, or in an array including a side-by-side arrangement), and optionally comprise a plurality of layers, such as at least two layers, preferably which are stacked (e.g., either a stack of single devices, or a stack of arrayed devices). Of course, the devices of the present invention optionally can be fabricated attached to other devices (optical or non-optical), or elements of devices (e.g., electrodes and the like).

Additional features and variations of the invention will be apparent to those skilled in the art from the entirety of this application, including the detailed description, and all such features are intended as aspects of the invention. Likewise, features of the invention described herein can be recombined into additional embodiments that also are intended as aspects of the inventions irrespective of whether the combination of features is specifically mentioned as an aspect or embodiment of the invention. Also, only such limitations which are described herein as critical to the invention should be viewed as such; variations of the invention lacking limitations which have not been described herein as critical are intended as aspects of the invention. In addition to the foregoing, the invention includes, as an additional aspect, all embodiments of the invention narrower in scope in any way than the variations specifically described.

DETAILED DESCRIPTION OF THE INVENTION

Figure 1:
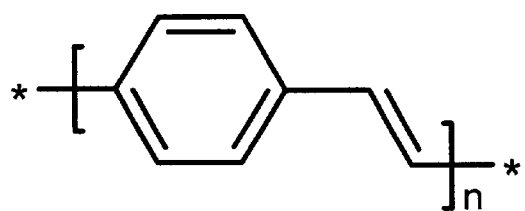
FIG. 1 depicts the chemical structure of poly(phenylene vinylene), PPV. Symbol: n, ranging from about 6 to about 100,000; *, indicating continuation of the polymer structure.

Among other things, the present invention provides a family of optical devices including lasers and optical amplifiers, which are based on uniquely-designed polymers (and polymer blends) which combine the nonlinearity of second-order nonlinear optical (2°-NLO) polymers with the electroluminescence of conjugated polymers.

Certain standard terms are employed in describing the invention. Illustrative definitions of these terms are set out below, and in the Examples which follow. Should there be any term that is left undefined, or any possible ambiguity in the meaning of a term, the broadest possible definition known in the optics, electronics, and telecommunications fields that is consistent with the scope and goals of the invention is to be applied. Also, like numbering is used for the same components in each of the Figures and in the descriptive text.

Definitions

According to the invention, preferably a "device" includes any single preferred entity as set forth herein (e.g., including, in particular, a waveguide), or any combination of elements (e.g., laser, amplifier, and the like) either alone, or, in a higher level of organization (e.g., present in a system or subsystem such as a board or motherboard, present as part of a telecommunications device, or other organization or device). Preferably these entities are employed in optical communication systems, although each may exist in any combination, or independently, or as part of a communications system or other system that is other than predominantly optical (i.e., a mix of optical and nonoptical systems). Desirably a device according to the invention is optically active (as further described herein), or includes optically active components, although passive devices (or devices containing passive components) are also contemplated by and preferred according to the invention. However, one unifying feature of all the devices of the invention is their incorporation of a second-order nonlinear optical (2°-NLO) polymer, particularly a polymer having electroluminescent properties that are appropriate for the particular application (e.g., infrared or ultraviolet), as further described below.

The expression "optical communication system" or "optical system" as used herein refers to any system which employs optical signals to convey information across an optical waveguide medium. Such optical systems include, but are not limited to, telecommunications systems, cable television systems, local area networks (LANs), and the like.

An "amplifier" or "light amplifier" is a device which operates upon light of a given intensity and produces light of a greater intensity.

A "diode" is a device that conducts electricity in one direction only. A "light emitting diode" additionally emits light.

A "laser" is a device that provides light amplification by stimulated emission of radiation in a resonator cavity. A laser provides a single band wavelength of a coherent light source. A light "amplifier" is a light amplification apparatus in which light is amplified by stimulated emission of radiation.

"Stimulated emission of radiation", involves atoms, ions, or molecules (for simplicity, referred to herein as "atoms") which have at least two well defined energy levels, a "higher level" and a "lower level". An atom in a higher energy level has a natural tendency to undergo a "transition" to the lower energy level. In making such a transition, the atom gives off one photon of light having a well-defined frequency or wavelength which is a function of the difference between the two energy levels (i.e., the upper level at which the atom starts and the lower level to which it descends). When this occurs naturally, in the absence of stimulation, it is known as "spontaneous emission."

However, several phenomena may occur when light impinges on atoms. The light may be reflected or transmitted, or may be absorbed. When light is absorbed, the light causes the atoms to move from a lower energy level to a higher level, and later undergo a "transition" to a lower level. When such transition occurs, the energy may be converted to heat or the atom may give off a photon of light having a wavelength or frequency corresponding to the difference between the two levels. This latter phenomenon is known as "fluorescence." When an atom is already at the higher of two permissible energy levels and a photon of light having this well-defined wavelength or frequency impinges on that atom, the atom then descends to the lower energy level. However, it will give off an additional photon of light having the same wavelength or frequency, polarization phase and direction as the photon of light which initially impinged upon the atom. This is known as "stimulated emission".

"Luminescence" is emission of light by any physical or biological process. By comparison, fluorescence is luminescence that is caused by absorption of radiation at one wavelength followed by nearly immediate radiation of another wavelength.

A "second-order nonlinear optical" (2°-NLO) polymer is a polymer that is optically active—i.e., its index of refraction changes due to an applied electric field, and the change is proportional to the square of the applied electric field. Preferably according to the invention, a 2°-NLO polymer is obtained by the incorporation into a polymer backbone of a chromophore having 2°-NLO characteristics, and/or which exhibits those characteristics when present in the polymer backbone. A 2°-NLO polymer according to the invention optionally can be a polymer blend. Desirably such a 2°-NLO polymer is electroluminescent.

"Alkyl" refers to a cyclic, branched, or straight chain aliphatic group containing only carbon and hydrogen, for example, methyl, pentyl, and adamantyl. Alkyl groups can be unsubstituted or substituted with one or more substituents, e.g., halogen, alkoxy, acyloxy, amino, hydroxyl, mercapto, carboxy, benzyloxy, aryl, and benzyl. Alkyl groups can be saturated or unsaturated (e.g., containing alkenyl or alkynyl subunits at one or several positions). Typically, alkyl groups contain 1 to about 12 carbon atoms, preferably 1 to about 10, or 1 to about 8 carbon atoms.

"Aryl" refers to a monovalent aromatic carbocyclic or heterocyclic group having a single ring (e.g., phenyl), multiple rings (e.g., biphenyl), or multiple condensed rings (e.g., naphthyl or anthryl). Aryl groups can be unsubstituted or substituted with amino, hydroxyl, alkyl, heteroalkyl, alkoxy, halo, mercapto, sulfonyl, nitro, and other substituents. Typically, the aryl group is a substituted single ring compound. For example, the aryl group is a substituted phenyl ring.

The term "halo" or "halogen" is defined herein to include fluorine, bromine, chlorine, and iodine.

The term "alkoxy" is defined as —OR, wherein R is alkyl of one to twelve carbons attached to an oxygen forming such groups as methoxy, ethyloxy, butyloxy, and the like, and isomeric forms thereof.

The term "hydroxy" is defined as —OH.

The term "amino" is defined as —NR$_2$, wherein each R, independently, is alkyl or hydrogen.

The term "cyano" is defined as —CN.

The term "sulfonyl" is defined as HOSO$_2$—

The term "alkylsulfonyl" is defined as R—SO$_2$—, where R is alkyl.

The term "arylsulfonyl" is defined as R—SO$_2$—, where R is aryl.

The term "diazo" is defined as —N=N—.

The term "electron donating group" is defined as a group that tends to donate the electrons in a covalent bond away from itself. Unless otherwise specified, any appropriate electron donating group can be employed according to the invention. Similarly, "optionally substituted" indicates that any appropriate group can be employed for substitution, so long as such substitution does not negate the desirable features of the resulting device. Preferably an electron donating group is selected from the group consisting of hydrogen, hydroxy, amino, $C_{1-12}$alkoxy (optionally further substituted such as with hydroxyl or amino), $C_{1-12}$dialkylamino (optionally further substituted such as with hydroxyl or amino), $C_{1-12}$alkylarylamino (optionally further substituted such as with hydroxyl or amino), and diarylamino (optionally further substituted such as with hydroxyl or amino). However, any appropriate electron donating group such as is known in the art desirably may be employed.

The term "electron withdrawing group" is defined as a group that tends to attract or draw the electrons in a covalent bond toward itself. Unless otherwise specified, any appropriate electron withdrawing group can be employed according to the invention. Similarly, "optionally substituted" indicates that any appropriate group can be employed for substitution, so long as such substitution does not negate the desirable features of the resulting device. Preferably an electron withdrawing group is selected from the group consisting of hydrogen, cyano, $COR^2$, $C_{1-12}$mono- or poly-haloalkyl (optionally further substituted), $C_{1-12}$alkenyl (optionally further substituted such as with an additional electron withdrawing group), halo, nitro, sulfonyl, $C_{1-12}$alkylsulfonyl (optionally further substituted), and arylsulfonyl (optionally further substituted).

The chemical formulas representing various compounds or molecular fragments in the specification and claims may contain variable substituents in addition to expressly defined structural features. These variable substituents are identified by a letter or a letter followed by a numerical superscript, for example, "$Ar^i$" or "$R^i$" where "i" is an integer. These variable substituents are either monovalent or bivalent, that is, they, represent a group attached to the formula by one or two chemical bonds. Groups $R^i$ and $R^j$ represent monovalent variable substituents if attached to the formula $CH_3$—$CH_2$—$C(R^i)(R^j)H$. When chemical formulas are drawn in a linear fashion, such as those above, variable substituents contained in parenthesis are bonded to the atom immediately to the left of the variable substituent enclosed in parenthesis. When two or more consecutive variable substituents are enclosed in parenthesis, each of the consecutive variable substituents is bonded to the immediately preceding atom to the left which is not enclosed in parentheses. Thus, in the formula above, both $R^i$ and $R^j$ are bonded to the preceding carbon atom.

Chemical formulas or portions thereof drawn in a linear fashion represents atoms in a linear chain. The symbol "–" in general represents a bond between two atoms in the chain. Thus, "HO—$CH_2$—$CH(R^j)$—$CH_3$" represents a 2-substituted-1-hydroxypropane compound. In a similar fashion, the symbol "=" represents a double bond, e.g., $NH_2$=$N(R^j)$—$CH_3$.

The carbon atom content of variable substituents is indicated in one or two ways. The first method uses a prefix to the entire name of the variable such as "$C_1$-$C_4$", where both "1" and "4" are integers representing the minimum and maximum number of carbon atoms in the variable. The prefix is separated from the variable by a space. For example, "$C_1$-$C_4$ alkyl" represents alkyl of 1 through 4 carbon atoms, (including isomeric forms thereof unless an express indication to the contrary is given). Whenever this single prefix is given, the prefix indicates the entire carbon atom content of the variable being defined. Thus $C_2$-$C_4$ alkoxy describes a group $CH_3$—$(CH_2)_n$—O where n is zero, one or two. By the second method, the carbon atom content of only each portion of the definition is indicated separately by enclosing the "$C_i$-$C_j$" designation in parentheses and placing it immediately (no intervening space) before the portion of the definition being defined. By this optional convention ($C_1$-$C_3$) alkoxycarbonyl has the same meaning as $C_2$-$C_4$ alkoxycarbonyl because the "$C_1$-$C_3$" refers only to the carbon atom content of the alkoxy group. Similarly while both $C_2$-$C_6$ alkoxyalkyl and ($C_1$-$C_3$) alkoxy-($C_1$-$C_3$) alkyl define alkoxyalkyl groups containing from 2 to 6 carbon atoms, the two definitions differ since the former definition allows either the alkoxy or alkyl portion alone to contain 4 or 5 carbon atoms while the latter definition limits either of these groups to 3 carbon atoms. With respect to the above definition, $C_{1-7}$ alkyl is methyl, ethyl, propyl, butyl, pentyl, hexyl, and the like, and isomeric forms thereof.

A "waveguide" is an entity of material boundaries or structures for guiding electromagnetic waves. More specifically, a waveguide is an optical waveguide, or any structure capable of guiding optical power (i.e., carrying one or more optical signals). According to the invention, a waveguide preferably is comprised of a layer of 2°-NLO polymer, optimally which exhibits electroluminescence. Thus, the waveguide itself desirably functions as an emissive layer (as further described herein). Desirably the waveguide is flanked on at least one side by a solid support capable of supporting the waveguide, wherein the solid support can be any appropriate material, e.g., glass, plastic, metal, and the like. The solid support need not be entirely rigid (although completely rigid materials can be employed), but can have some amount of flexibility. Preferably the waveguide also is flanked on at least one side by cladding. Whenever a solid support is employed to support the waveguide, the support must not directly contact the waveguide, but must be separated from the waveguide by cladding. Depending on the proper functioning of the waveguide (e.g., whether it is a component of a laser or an amplifier), the index of refraction in any layer that directly contacts the waveguide (i.e., on one or more sides, and preferably on all sides) may vary with respect to the index of refraction in the waveguide itself (e.g., may be greater than, less than, or equivalent to the waveguide's index of refraction). Accordingly, cladding can include one or more layers of any appropriate material, such as 2°-NLO polymer, glass, plastic, silica, or other appropriate material, and further can include a buffer (e.g., as set out in FIG. 11). According to the invention, "a buffer" is an optical buffer, i.e., a medium that does not exhibit any optical activity or optical nonlinearity with lower refractive index. Optionally according to the invention, the cladding layers can be conductive as described in U.S. Pat. No. 5,887,116 (incorporated by reference).

The index of refraction in each layer (e.g., of a waveguide or of an optical switch) is impacted, among other things, by the chromophore concentration, the nature of the chromophore, and the nature of the polymer backbone. Of course, these parameters can easily be optimized by one skilled in the art. Desirably, the waveguide can comprise any part of an optical device (e.g., preferably a laser or amplifier). Similarly, the electroluminescence can vary due to extent of conjugation, planarity, carbon chain length, and other properties well known to those skilled in the art, and as further described herein.

To function as a waveguide as in the preferred embodiments of the invention, the index of refraction in any layer surrounding the waveguide must be less than the index of refraction in the waveguide itself. This difference in refractive index between the waveguide itself and any adjacent layer (i.e., "Δn" in Example 2) preferably is equal to or greater than 0.001, and desirably is no more than 0.1. However, with alternate thicknesses of waveguide, it is conceivable that the range of differences may be slightly broader. Such alternates are contemplated by the present invention.

Thus, desirably the present invention contemplates an "asymmetric waveguide" and a "symmetric waveguide" (e.g., as described in PCT WO 01/06305, incorporated by reference). In the case of an asymmetric waveguide, i.e., comprised of a waveguide surrounded by an upper and lower cladding layer, the refractive indices of the upper and lower layers are not equal to each other, and are less than the refractive index of the waveguide. In the case of a symmetric waveguide, i.e., comprised of a waveguide surrounded by an upper and lower cladding layer, the refractive indices of the upper and lower layers are equal to each other, and are less than the refractive index of the waveguide. This is further described in Example 2.

An "active" device (or an active component of a device, such as a grating) according to the invention is one which responds to an applied electric field. An active device must contain at least one active grating, but each waveguide present in the device (i.e., in the case of a device comprised of more than one waveguide) need not necessarily contain a grating. In other words, with an active device, its optical properties are changed when a voltage is applied to it. By comparison, a "passive" device (or a passive component of a device, such as a grating) according to the invention is one that does not change its characteristics when a voltage is applied to it, and/or a device that functions without needing to apply a voltage (i.e., and to which a voltage is not applied).

According to the invention, an "electric field" is generated with any appropriate power source, and is communicated to the device (e.g., to a grating present in a device) by means of an electrode, specifically an "anode." Preferably the electrode is not in electric contact with the device, i.e., the affects achieved are due solely to the electric field generated and not conductance of electricity.

Desirably the anode is a high work function material, however this is not required. Preferably, however, the anode is closely positioned to the device such that it can exert its effect on a Bragg grating, allowing that grating to be tuned (e.g., field-induced tuning), as previously described. When so positioned, the anode can be called a "distributed Bragg reflector (DBR) tuning electrode."

Also according to the invention an electrode can be employed to inject electrons into a device (e.g., a layer or component of a device). Such an electrode is referred to as a "cathode", and preferably is made of a low work function material. Desirably the cathode is positioned so as not to directly contact the waveguide (emissive layer) itself, but to be separated from the waveguide by another layer further described herein, the "electron rich layer" (or "electron injecting layer").

The electrodes (i.e., anode or cathode) used in the present invention preferably are made of at least one of the following materials: metals such as gold, silver, platinum, copper, and alloys; conductive materials such carbon black, conductive epoxy, or indium-tin-oxide (ITO). In particular, with active devices, or active components of devices, preferably transparent electrodes can be incorporated in the form of transparent layers of ITO. Under proper conditions ITO can form a thin film on a glass or polymer substrate which is electrically-conductive and optically-transparent in the ultraviolet to infrared region of the electromagnetic spectrum. It can be deposited as a thin film layer (typically 100 nanometer thickness) using an alloy of Indium and Tin and Oxygen atmosphere by reactive sputtering techniques. Reactive sputtering techniques include DC, RF, and Magnetron sputtering, and are known to those working in the field. However, any electrode having the ability to conduct charge and capable of functioning as an "electrode" as that term is understood in the art can be employed in the methods and devices of the invention.

Figure 6:
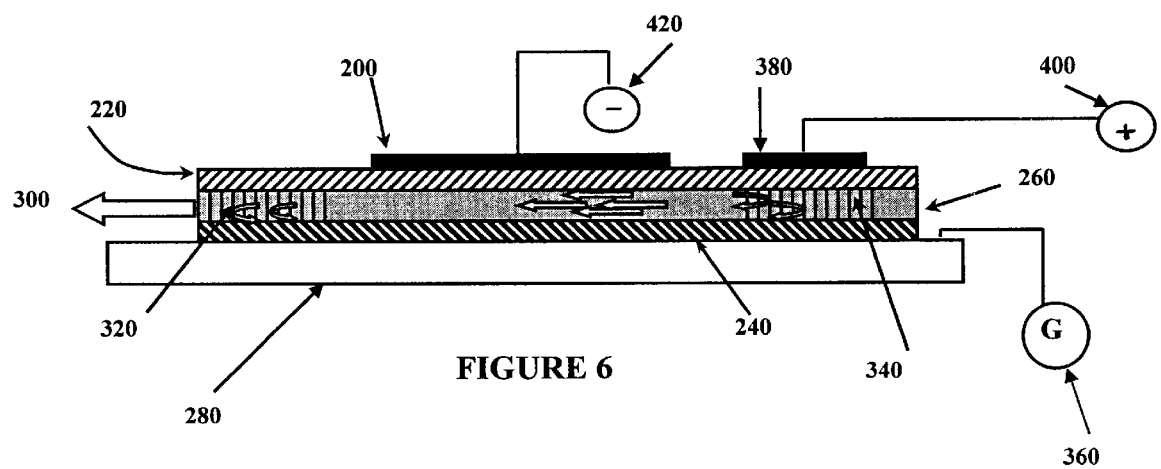
FIG. 6 depicts the structure of a waveguide laser with one active distributed Bragg grating, where applying a positive voltage to the distributed Bragg grating will tune the lasing wavelength. The open arrows in the emissive layer show direction of photon flow. Symbols: 200, Cathode; 220, Electron Injecting Layer; 240, Hole Injecting Layer; 260, Emissive Layer (waveguide); 280, Hole Injecting Electrode; 300, Laser Output; 320, Inactive Bragg grating; 340, Active Distributed Bragg Grating; 360, Ground lead; 380, Anode; 400, Positive lead; 420, Negative lead.

Further according to the invention, a device includes yet another electrode, that can be considered a "hole-injecting electrode" (e.g., depicted in FIG. 6, and sometimes is referred to as a "ground electrode"). Preferably this is made of either ITO or gold, or any other appropriate high work function material. The hole injecting electrode preferably contacts a device layer flanking the waveguide and referred to herein as the "hole injecting layer."

Generally, according to the invention an electrode can powered by a small amount of voltage, e.g., from 0 to about 50 volts, although in certain applications, it may be preferable to employ a higher voltage. Voltage can be supplied by either an AC or DC power source. Preferably the electrodes do not touch each other, or come close enough to interfere with each other's function. With some positionings of the cathode and anode it may be necessary to include a "ground" within the devices of the invention.

According to this invention, a "grating" is a means of separating an optical signal. A particularly preferred grating for use in the invention is a Bragg grating, especially a reflective Bragg grating, or a distributed Bragg grating (DBR). A "Bragg grating" is an element for selectively controlling specific wavelengths of light within a waveguide. A typical Bragg grating contains a length of waveguide that includes a plurality of periodic perturbations in the index of refraction, wherein the perturbations are substantially equally spaced along the length of the waveguide. These perturbations selectively reflect light having a wavelength ($\lambda$) equivalent to twice the spacing ($\Lambda$) between the successive perturbations (i.e., $\lambda=2n_{eff}\Lambda$, where $\lambda$ is the vacuum wavelength and $n_{eff}$ is the effective refractive index of the propagating mode). The light that is not selectively reflected by the Bragg grating passes through the grating unimpeded. Preferably according to the invention, the Bragg grating is made of 2°-NLO polymer, which optionally can either be or not be electroluminescent. Especially preferred is the situation where the grating is formed of the same electroluminescent polymer as is the waveguide (i.e., emissive layer, further described herein), in the case where an electroluminescent 2°-NLO is employed for the emissive layer.

With respect to the Bragg grating, a passive reflector is one that is not tunable. It has no electric field control, e.g., it is a passive distributed Bragg reflector. Also, with no electric field applied to a grating, a passive Bragg reflector is obtained. By comparison, and as discussed in Example 8 of PCT WO 01/06305, the properties of a grating made of 2°-NLO polymer (e.g., the ability to reflect light at a particular angle) can be changed by application of an electric field. In particular, the angle of incident reflection can be adjusted by applying a voltage. The ability to control this angle provides for "tunability" of the reflective properties of the grating.

Preferably according to the invention, the Bragg grating (or other appropriate grating) is positioned directly within the emissive (or waveguide) layer (e.g., as depicted in FIG. 6). Also preferred, however, is the situation where the Bragg grating is positioned outside the emissive layer, e.g., flanking it so as to interact with the evanescent wave traveling inside the waveguide (i.e., emissive layer). One of ordinary skill would be familiar with such alternate and appropriate positioning of the Bragg grating.

Figure 13:
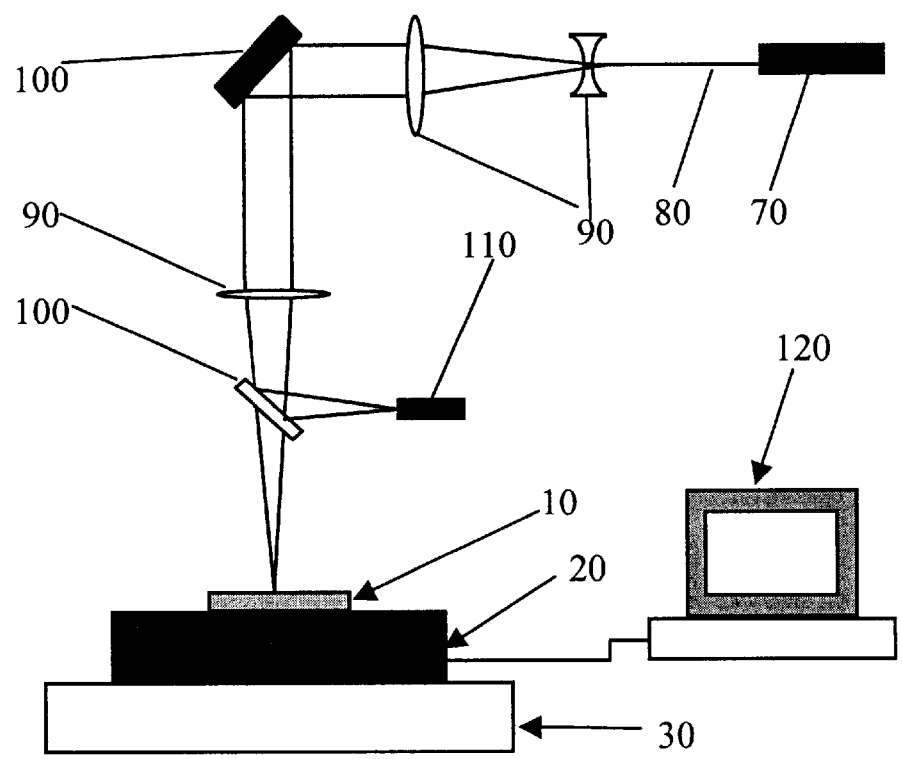
FIG. 13 is a diagram showing a sample exemplary apparatus to be employed for waveguide fabrication by a direct laser writing technique. Symbol: 10, sample; 20, X-Y stage; 30, optical table; 70, laser; 80, laser beam; 90, lens; 100, mirror; 110, beam monitor; 120, computer.

Conventional gratings such as the fiber Bragg grating are typically manufactured by using a waveguide (e.g., an optical fiber) that includes one or more elements in their core that are sensitive to ultraviolet light, and then exposing the waveguide at periodic intervals to high intensity ultraviolet light (or other appropriate light), e.g., from an excimer laser. Generally, the appropriate periodic spacing of perturbations in a grating is accomplished with use of some sort of physical mask to adjust areas exposed to the laser (e.g., a photo mask), a phase mask, or a pair of interfering beams (e.g., holographic techniques). Further preferred approaches for generation of a grating according to the invention, particularly a Bragg grating, are described below, and in the Examples which follow, as well as are illustrated in FIG. 13. However, other means of grating generation known in the art optionally can be employed. Furthermore the grating optionally can be other than one made of 2°-NLO, for instance a metallic grating, a photosensitive polyimide (e.g., that does exhibit 2°-NLO properties), or other appropriate material.

According to the invention the "emissive layer" includes a waveguide as previously described. This layer preferably is comprised of electroluminescence material (e.g., organic material), and desirably also may have 2°-NLO properties. Thus while it necessarily must be electroluminescence, combining this property with 2°-NLO properties merely provides for ease of fabrication of the devices.

Figure 2A:
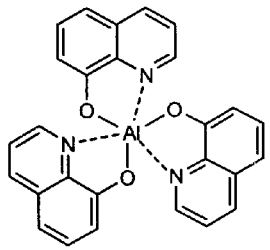
FIGS. 2A–H depicts the chemical structures of commercially-available compounds for visible emission including Aluminum triquinoline (Alq) (FIG. 2A), and TPD (FIG. 2B), and commercially-available compounds and polymers for infrared emission, including IR5 (FIG. 2C), $H_2Pc$ (FIG. 2D), IR26 (FIG. 2E), DCM (FIG. 2F), PY-1 (FIG. 2G), and PVK (FIG. 2H).
Figure 2B:
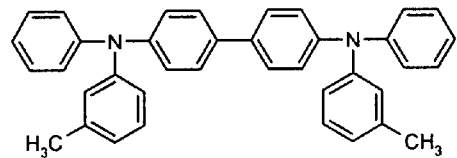
Figure 2C:
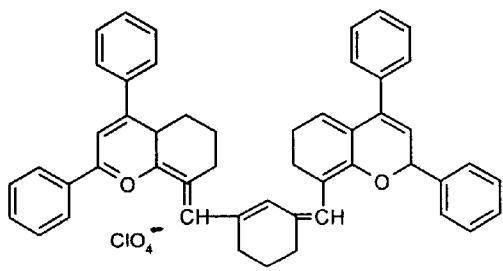
Figure 2D:
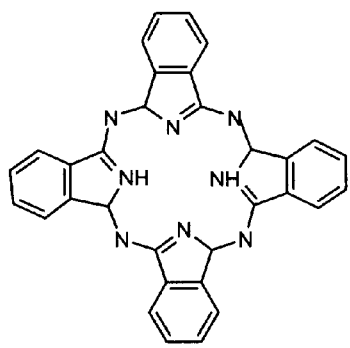
Figure 2E:
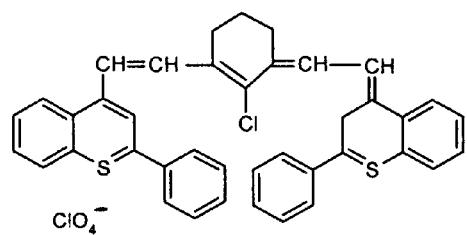
Figure 2F:
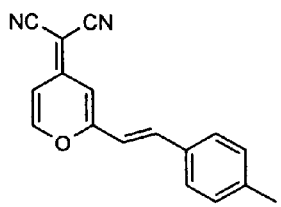
Figure 2G:
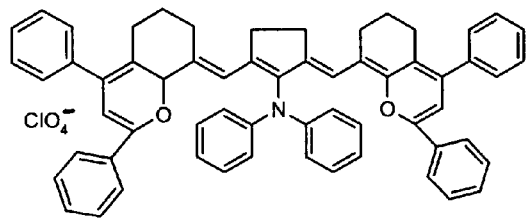
Figure 2H:
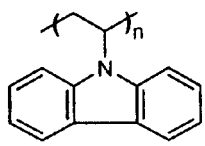

The devices of the invention further preferably comprise a "hole transport layer" which desirably is comprised of TPD (depicted in FIG. 2B), any hole-transporting cladding, or any appropriate material (e.g., organic) capable of transporting holes.

Figure 9:
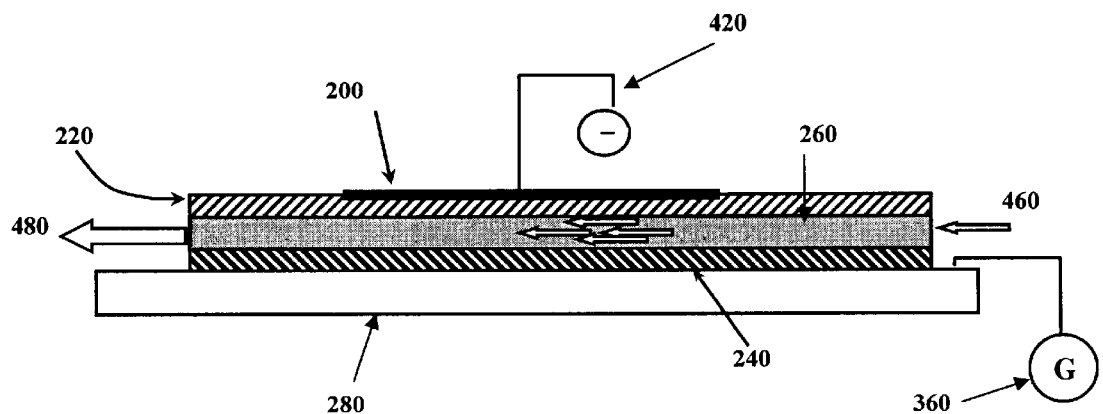
FIG. 9 depicts the structure of a waveguide amplifier. The open arrows in the emissive layer show direction of photon flow. Symbols: 200, Cathode; 220, Electron Injecting Layer; 240, Hole Injecting Layer; 260, Emissive Layer (waveguide); 280, Hole Injecting electrode; 360, Ground lead; 420, Negative lead; 460, Input Optical Signal; 480, Amplified Signal.

The devices of the invention also preferably comprise an "electron-rich" (or "electron-injecting") layer. This layer desirably is comprised of aluminum triquinoline (Alq) (depicted in FIG. 2A), any electron-injecting cladding, or any other appropriate material (e.g., organic) capable of injecting electrons. Preferably the layers are positioned as depicted in FIGS. 6 and 9.

General Principles of Operation of a Light Emitting Device

Figure 4:
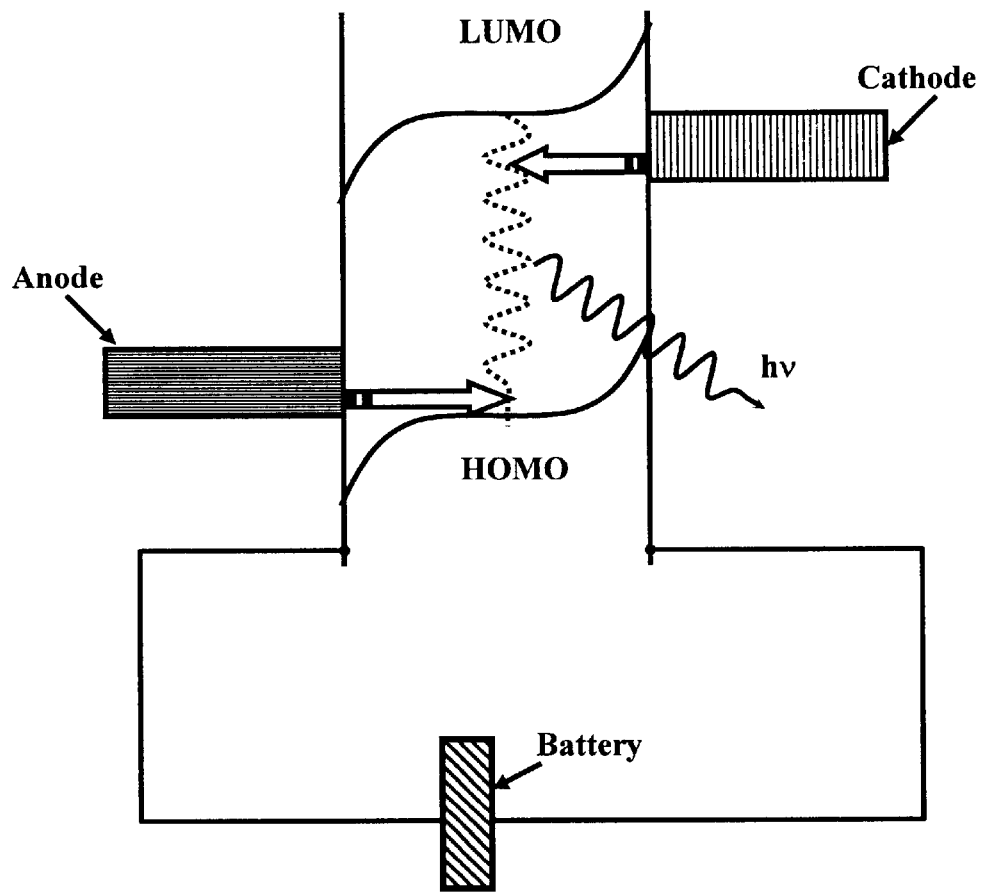
FIG. 4 depicts energy levels and tunneling in a single layer, forward biased semiconducting organic material by the steps of charge injection, transport, and recombination. Symbols. Battery, battery or power source; LUMO, conduction band; HOMO, valance band; hv, light photon.

The operation of a polymer light emitting diode may be determined essentially by three processes: charge injection, transport, and recombination, as depicted in FIG. 4.

In terms of charge transport, absorption of a photon will promote an electron from HOMO (valance band) to LUMO (conduction band) producing an electron-hole pair which is mobile. Because of the delocalized nature of the π bonding states, the hole mobility is much higher than the electron mobility in the conjugated organic systems (Antoniadis et al., "Carrier deep-trapping mobility-lifetime products in poly(p-phenylene vinylene)", Appl. Phys. Lett. 65: 2030–33 (1994)). The positively charged hole is quickly filled by (i.e., recombined with) the neighboring electrons, giving rise to a hole transporting mechanism.

Upon recombination of the electron-hole pair, a photon is released (termed "luminescence"). This electroluminescence behavior of conjugated polymers is similar to those of organic chromophores and dyes. In fact many organic dyes are used as electroluminescent materials (Hebner et al., "Ink-jet printing of doped polymers for organic light emitting devices", Appl. Phys. Lett., 72: 519–521 (1998)). The quantum efficiency of the luminescence depends on the lifetime and radiative decay of these electron-hole pairs. Also, as these holes and electrons are transported along the conjugation path they encounter defect sites where they are trapped and may decay non-radiatively.

To obtain electroluminescence in a semiconducting polymer it is necessary to inject an electron and a hole into the conducting material to recombine across the band gap and emit a photon. The electrons need to be injected into the conduction band (LUMO) and holes into the valance band (HOMO). To do so, a thin film of the organic material can be sandwiched between a low work-function metal (such as calcium, silver or magnesium) and high work-function material such as ITO (indium tin oxide) or gold (see Sheats et al., Science, 273:884–888 (1996)). By forward biasing the device, an electron is pushed through the metal electrode into the polymer's conduction band while a hole is injected into the valance band. A recombination of the electrons with holes occur which results in electroluminescence.

Characterization of the mobilities and behavior of electron and hole charge carriers in soluble poly(dialkoxy-p-phenylenevinylene) gives good insight into the mechanisms that give rise to the electroluminescence. One such study has been performed by Blom and DeJong (Blom et al., "Device Operation of polymer light emitting diodes", Philips J. Res., 51: 479–494 (1998)), who concluded that in a single layer poly(phenylene vinylene) sandwiched between a low work-function layer such as Ca or Al (electron injectors) and a high work-function layer such as ITO or Au (hole injector), recombination occurs near the electron injecting surface due to the low electron mobility in the polymer. Also, at the junctions, the charge injection occurs by tunneling, of electrons and holes through contact barriers arising from the band offset between the polymer and the electrodes, resembling a Fowler-Nordheim tunneling through the barrier, which limits the charge injection (Marks et al., Synth. Met. 55: 4128 (1993); Parker, "Carrier tunneling and device characteristics in polymer light-emitting diodes", J. Appl. Phys. 75:1657 (1994)).

Figure 5:
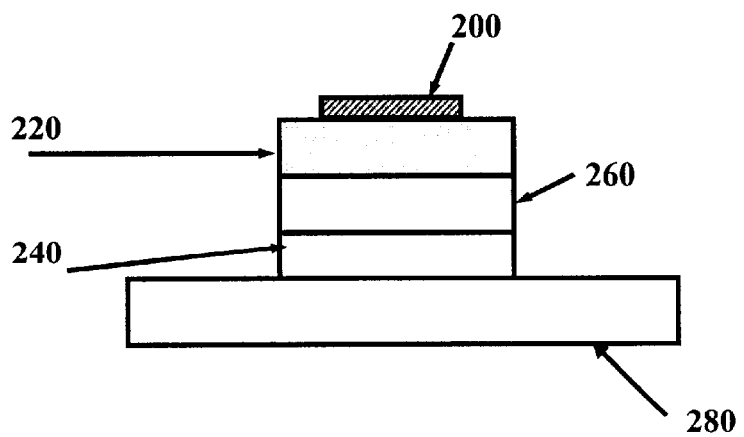
FIG. 5 depicts a cross section of an organic light emitting diode showing the arrangement of the layers. Symbols: 200, Cathode; 220, Electron Injecting Layer; 240, Hole Injecting Layer; 260, Emissive Layer (waveguide); 280, Hole Injecting Electrode.

This problem of limitation of charge injection can be solved by adding electron and hole transporting layers between the interfaces of the emissive layer as depicted in FIG. 5. Choosing the appropriate material will lower the barriers to facilitate charge injection.

Polymeric Blend Structures in Organic Light Emitting Diodes

An alternative way to enhance electroluminescence in organic light emitting diodes is through the use of a mixed blend of electron transporting and hole transporting components with the emissive material in a ratio which also maximizes the electroluminescent efficiency. It has been found by many researchers (e.g., see Wu et al., "Efficient organic electroluminescent devices using single-layer doped polymer thin films with bipolar carrier transport abilities", IEEE Trans. On Elec. Dev., 44:1269–1281 (1997), Cerullo et al., "Ultrafast energy-transfer dynamics in a blend of electroluminescent conjugated polymers", Chem. Phys. Lett. 288: 561–566 (1998), and Tasch et al., "Efficient red-and-orange light emitting diodes realized by excitation energy transfer from blue light emitting conjugated polymers", Phys. Rev. B, 56:4479–4483 (1997)) that this configuration has certain advantages over layered material. One of the constituent components is a polymer and the rest of the components are entered as a host. By changing the emissive component the emission color can be changed. Color tuning also can be achieved by energy transfer interactions. A good example is the color tuning of blue-emitting poly(phenylene vinylene)/poly(decyl-thiophene) blends where the amount of poly(decyl-thiophene) changes the emission color from green to orange to red while increasing the electroluminescent efficiency (List et al., "Efficient single-layer yellow light emitting diodes with ladder type Poly(p-phenylene)/poly(decyl-thiophene) blends", *Solid State Communication,* 109:455–459 (1999)). In a similar manner, color tuning into the infrared is possible.

Novel Optical Devices According to the Invention

The prior-described problem of tunneling of electrons and holes through the contact barriers of the electrodes sandwiching the single layer PPV, or similar polymer, can be solved by adding transport layers between these electrodes and the PPV layer, also termed an emissive layer. A typical arrangement is shown in FIG. 5, in which the low work-function metal layer (the electrode) is separated from contact with the emissive layer by an electron injection layer, also designed to promote the injection of electron carriers into the emissive layer. A high work-function buffer layer is disposed between an ITO substrate and the emissive layer. The high work-function buffer layer is a hole transporting buffer layer, such that holes from the ITO substrate are still injected into the emissive layer. In this configuration (e.g., as depicted in FIG. 5), the metal layer and the ITO substrate layer may be biased in a cathode and anode manner to inject electron and hole carriers into the emissive layer for increasing the electrolumiscent efficiency. In a preferred embodiment, the design has the structure of a three layer electroluminescent device, e.g., as in FIG. 5, where the emissive layer (the waveguide) is comprised of the electroluminescent 2°-NLO polymers described herein.

Figure 10:
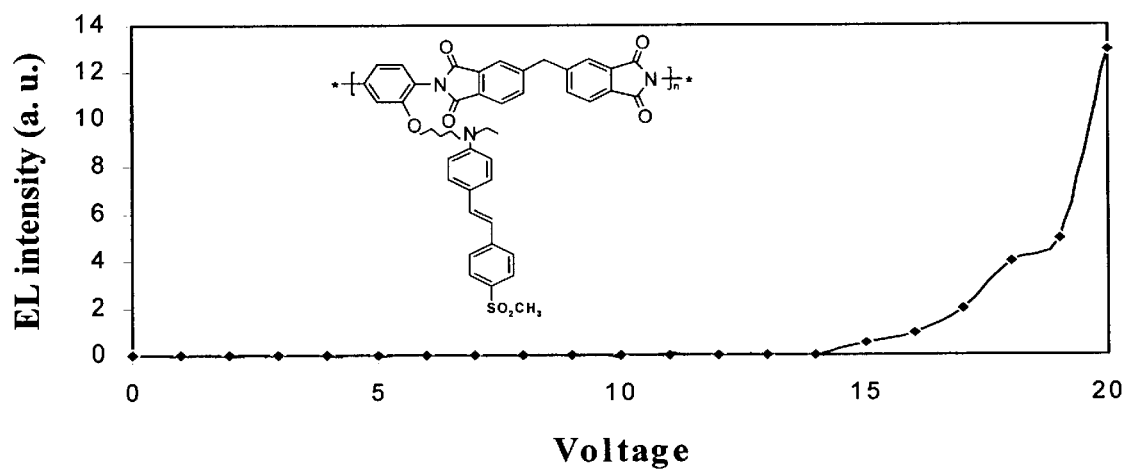
FIG. 10 shows electroluminescence intensity (bright yellow) as a function of voltage for a polyimide modified with dialkyl-amino-sulfone-stilbene pendant chromophore. A 4 $\mu$m spin-coated film was sandwiched between ITO and Ag top electrode.

For effective waveguiding, the device has to satisfy one more condition. The refractive index of the emissive layer has to be greater than the refractive indices of both the lower and upper cladding layers. In particular, a waveguide layer in a device according to the invention (e.g., a laser or amplifier) can comprise one or more polymer waveguide layers as depicted in FIG. 10. FIG. 10 diagrams a waveguide where the refractive indices $n_1$, $n_2$, and $n_3$, are all different. The layers having these respective indices can comprise either air, buffer, and/or 2°-NLO polymer. A "buffer" can be another polymer or any other material which: (1) has a lower refractive index than the guiding layer and light of the relevant range (i.e., range of chromophore excitation of chromophore employed in the device) passes through unaffected, (2) is employed to separate one layer from another layer or material (e.g., electrode), and (3) is noninterfering with the optical properties of layers above and/or below the buffer layer. Thus, a buffer layer can act merely as a separator and can be, for instance, a polymer such as polyimide, where the polymer (polyimide) does not contain any chromophor. In particular, preferably the buffer is polyimide, PMMA, or polystyrene that does not contain a chromophor.

Once the layers are laid out, the waveguide is constructed by bleaching the material under UV radiation with the waveguide protected by a mask. Alternately the waveguide may be laser written. FIG. 6 represents one such configuration of a device according to the invention, a preferred laser (and amplifier, as described below). FIG. 6 is a cross-sectional view of the preferred waveguide laser according to the invention having a waveguide layer formed of a 2°-NLO electroluminescent polymer sandwiched between an electron injecting layer and a hole transporting bottom layer. The electron injecting layers and hole transport layers correspond to the low work-function and high work-function layers, respectively, shown in FIG. 5.

In the configuration of FIG. 6, the waveguide is used to form a laser with a gain region in the emissive layer that is primarily disposed below an upper contact layer that functions as a cathode. The cathode, as previously described, may be any suitable conductive layer, and is preferably a metal layer, such as a Mg or Al layer. The cathode, is shown with a lead for connecting it to an external power source. As described, the cathode functions to supply electrons to the gain region of the waveguide emissive layer to thereby increase electroluminescent efficiency. To facilitate this supply and to address the problems previously described with contacting a metal electrode directly to a polymer-based laser gain region, an electron-rich upper layer (the electron injecting layer) is adjacently disposed between the cathode and the gain region of the waveguide. Disposed at the other side of the waveguide opposite to the cathode is a hole injecting electrode (e.g., ITO), which is preferably coupled to ground. The hole-rich layer (or hole injecting layer) is adjacently disposed between the hole injecting electrode and the waveguide. While an ITO electrode is preferred for use as the hole injecting electrode, it may be substituted by a layer of gold or some other hole-rich, or high work-function, conductive layer, as it is desirable to have this layer to inject holes into the electroluminescent material in the gain region.

To establish the resonant cavity around the gain region, the waveguide is bounded by two reflective layers. The two reflective layers are preferably gratings formed in the waveguide by using a known technique, e.g., laser writing. The reflective layers shown are Bragg reflective gratings that optionally are formed of the same or similar material as the gain region. These gratings are so formed because of the ease of manufacturing and because of the advantages of the 2°-NLO properties imparted on these regions by the use of the compounds disclosed herein, as explained in further detail below. However, as previously discussed the reflective gratings may be other types of reflective gratings, including metal reflective gratings, and may be alternately positioned. Similarly, the emissive waveguide layer can be electroluminescent, but not 2°-NLO. As would be known, the number of periodic perturbations forming the Bragg gratings will determine their reflectivity and thus the linewidth of the laser emission from the waveguide laser. The arrows in FIG. 6 generally show the flow of photons in the gain region, and the reflection of photons from within the Bragg gratings.

The Bragg reflective gratings are shown disposed below the electron-rich upper layer and above the hole-rich bottom layer (with "top" and "bottom" being relative terms, and potentially reversible). These reflective gratings may be either passive or active, with preferably at least one of the gratings being an active grating. In FIG. 6, the rear reflective grating (i.e., depicted on the right in the FIG. 6) is shown as being an active reflective grating in that it is disposed below the anode, which is connected to an external power source. While it is contemplated that the anode is formed of a metal, any suitable conductive material may be used. The anode establishes an electric field across the active Bragg reflective grating to tune the reflectivity of this grating, since the Bragg reflective grating is formed of a 2°-NLO polymer and thus exhibits electric field-dependant reflective properties. By tuning the reflectivity of this grating, one can tune the output wavelength of the laser light from the waveguide. As described in further detail below, the central wavelength of the laser output can be tuned upwards of several nm into the infrared with voltages on the order of a few volts.

In the Bragg reflective gratings there is no need to inject electron and hole carriers, as they do not necessarily form part of the photon-producing gain region of the waveguide laser. Thus, in this configuration the Bragg reflective grating is an active reflective grating. Furthermore, while the forward Bragg reflective grating (shown at the very left of the emissive layer in FIG. 6) is a passive reflective grating, it optionally simultaneously may be used as an active reflective grating by similarly disposing a second anode on the electron-rich upper layer above this Bragg reflective grating. Further, as would be appreciated by persons of ordinary skill in the relevant art, the Bragg reflective gratings are designed to be substantially reflecting, with a maximum reflectivity over the range of the luminescence spectrum of the gain region. And at least one of the Bragg reflective gratings, e.g., the forward reflective grating (at the very left of the emissive layer in FIG. 6), should be partially transmitting to define an emission side of the waveguide.

Figure 7:
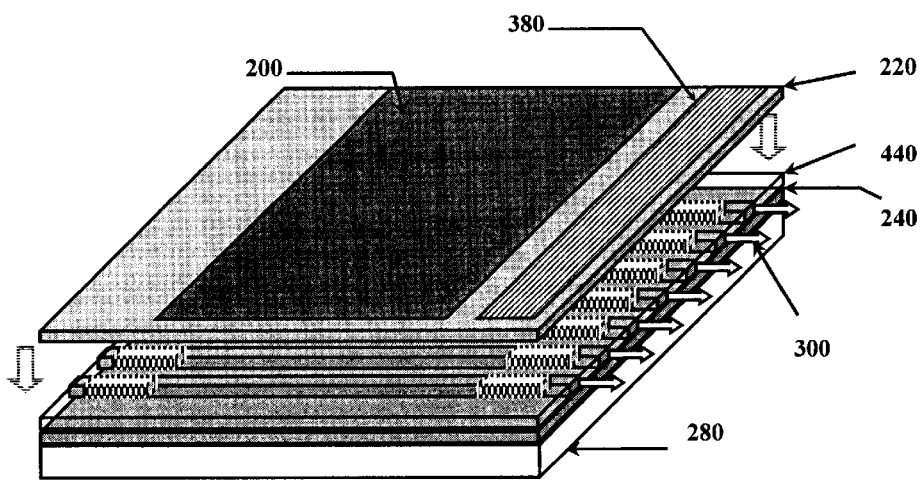
FIG. 7 depicts a closely spaced waveguide array of the organic waveguide laser of FIG. 6, which has been formed by photobleaching using masks and ultraviolet radiation. The top layer is shown lifted (designated by open arrows) for clarity. Symbols: 200, Cathode; 220, Electron Injecting Layer; 240, Hole Injecting Layer; 280, Hole Injecting electrode; 300, Laser or Amplifier Output; 380, Anode (here a DBR tuning electrode); 440, Patterned or arrayed emissive layer.
Figure 8:
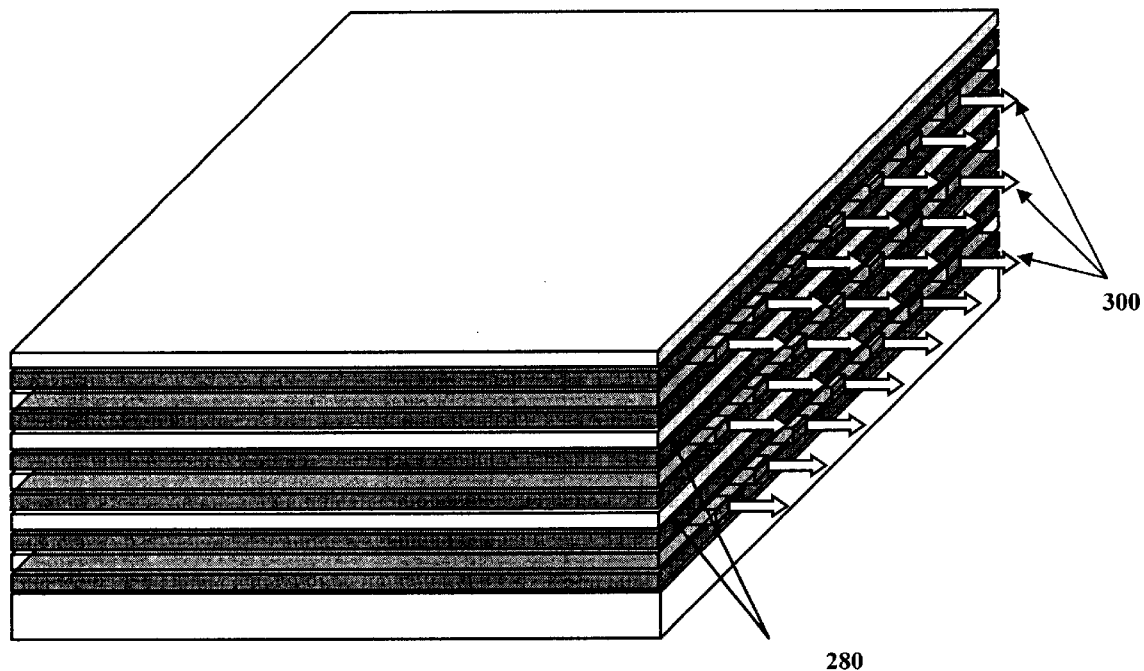
FIG. 8 depicts the stacking of multiple layers of the two-dimensional laser array of FIG. 7 above the array into a three-dimensional laser array to produce higher powers. Symbols: 280, Hole Injecting electrode; 300, Laser or Amplifier Output.

Since the width of the waveguide present in the laser and/or amplifier is small (e.g., about 5–6 $\mu$m) it is possible to construct a large array of waveguides (e.g., one example of such an array is schematically depicted in FIG. 7), or simply a long folded cavity on a single substrate to obtain higher intensity. By appropriately insulating one stack from another using insulating polymeric material such as polyimides, or any cladding or buffer material, it will be possible to stack multiple arrays to obtain a three dimensional m by n stacked array, where "m" is the number of devices present in a single layer, and "n" is the number of layers (e.g., one example of such an array is schematically depicted in FIG. 8).

Also, as depicted as a preferred embodiment in FIG. 9, the invention provides for optical amplifiers. These have similar configurations as the waveguide lasers depicted in FIG. 6, but the gratings either are absent or have been de-tuned (e.g., by an external electric field). The net result of this is a gain region in the emissive layer which does not have a resonant cavity such as is necessary for a laser. Furthermore, for an amplifier, a optical signal must be present. Also for an amplifier there is no need for an anode (as depicted in FIG. 6) unless a grating is to be de-tuned.

Thus, preferably the devices according to the invention comprise a single layer device (e.g., a single laser or amplifier comprised of a 2°-NLO polymer or polymer blend that exhibits electroluminescence, or a single layer of side-by-side lasers or amplifiers present in arrays and comprised of such polymers). Alternately, preferably the devices according to the invention comprise more than one layer of the laser(s) or amplifier(s), especially from two to ten layers of laser(s) or amplifier(s), desirably from two to six layers, and particularly two or three layers. When more than a single layer is present, optimally according to the invention the layers are "stacked" (although a side-by-side juxtaposition also can be employed, e.g., within a layer, or with respect to different layers). Desirably the optical devices as described above further comprise one or more buffer layers, as well as other optional components. Preferably, the grating(s) (e.g., distributed Bragg grating(s)) are present in the buffer layer (s) and/or the waveguide layer(s) and are comprised of 2°-NLO polymers and polymer blends according to the invention.

Blend Approach Employed in the Novel Optical Devices of the Invention

Presently, no electroluminescent device has been built or tested to obtain electroluminescence at the 1.3 $\mu$m wavelength Fujii et. al. report a 0.9 $\mu$m electroluminescent emission from metal-free phthalocyanine in a mixed layered/blend configuration (Fujii et al., "An organic infrared electroluminescent diode utilizing a phthalocyanine film", *IEEE Transactions on Electron Devices*, 44:1204–1207 (1997)). Many others report efficient visible emission using the blend approach with a dominant energy-transfer process following the electron injection. For the energy transfer to occur, there has to be an overlap between the emission line-width of the host and the absorption of the emissive dye according to the Dexter-Foster relation. Therefore by choosing the appropriate host and infrared dyes commercially available (e.g., available from Lambda Physik and Exiton) an organic light emitting diode device according to FIG. 5 can be constructed with the emissive layer constructed using one of the infrared dyes shown in FIGS. 2A–H.

Similarly, blends using rare-earth complexes and chelates can be employed. Rare-earth ions because of their intense luminescence have been investigated and used as active ions for many years (see, e.g., Sloof et al., "Optical properties of erbium-doped organic polydentate cage complexes", *Journal of Applied Physics*, 83:497–503 (1998)). High absorption cross-section of certain organic molecules and efficient energy transfer through the ligands to rare-earth ions provide a novel opportunity for pumping the rare-earth ions. Certain rare-earths, such as erbium have been the subject of intense experimentation and investigation for its 1.5–1.55 $\mu$m stimulated emission which coincides with the lowest absorption loss of the industrial optical fiber. It thus appears that complexes of erbium and neodymium and praseodymium can be employed to obtain lasing and amplification at 1.3 $\mu$m. Modifications of prior art methods of synthesis using well established principles should enable rapid synthesis of these complexes. These complexes optimally can be blended in other polymer hosts to utilize the Forster energy transfer between the host and the rare-earths which results in characteristic emissions of these ions (Chunjun et al., "Energy transfer process from polymer to rare-earth complexes", *Synthetic Metals*, 91:151–154 (1997)). It thus should be possible to obtain stimulated emission from these ions in a resonant cavity.

A synthetic approach also can be employed. Modifying the chemical structure of the conjugated semiconductors is another way to synthesize material which electroluminesces at a certain wavelength. Infrared and near-infrared electroluminescence has been obtained from main-chain polymers such as poly-thiophenes (see, e.g., Inganas et al., "Thiophene polymers in light emitting diodes: making multicolour devices", *Synthetic Metals*, 71:2121–2124 (1995)). The band-gap of the poly-thiophene is controlled over 2 eV by changing the nature and position of side-chain molecules. Another example of a main-chain polymer modification is reported by Baigent et. al. where a cyano-substituted thienylene phenylene vinylene copolymer is used as the emissive layer and electroluminescence occurs in the near infra-red (Baigent et al., "Polymer electroluminescence in the near infra-red", *Synthetic Metals*, 71: 2175–2176 (1995)). Electroluminescence from the side-chain polymers covers the spectrum between blue and infrared.

Figure 3A:
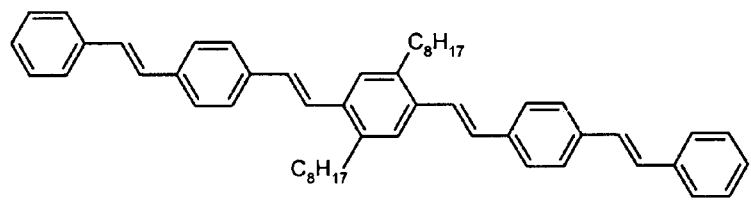
FIGS. 3A–E depicts the chemical structures of oligo (phenylene vinylenes) having structural modifications to shift the maximum to the red. The spectral width at full width half maximum is about 100 nm for all compounds. By comparison, the electroluminescent peak of each of the compounds is as follows: 460 nm (FIG. 3A); 490 nm (FIG. 3B); 510 nm (FIG. 3C); 540 nm (FIG. 3D); 560 nm (FIG. 3E); and 580 nm (FIG. 3F). Symbols: n=2, FIG. 3E; n=4, FIG. 3F.
Figure 3B:
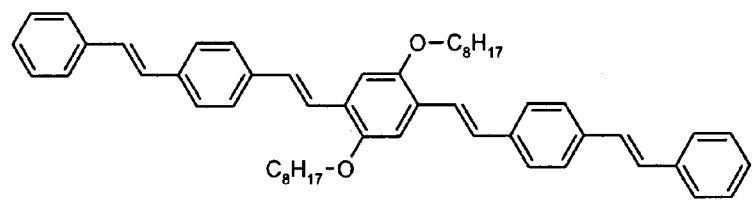
Figure 3C:
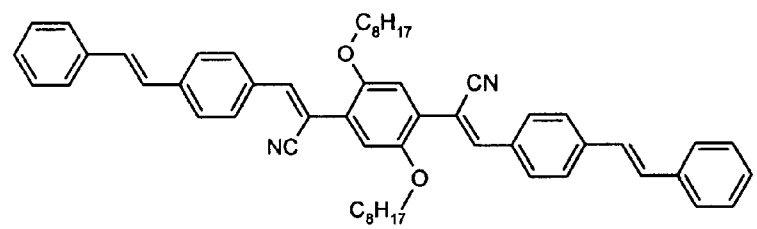
Figure 3D:
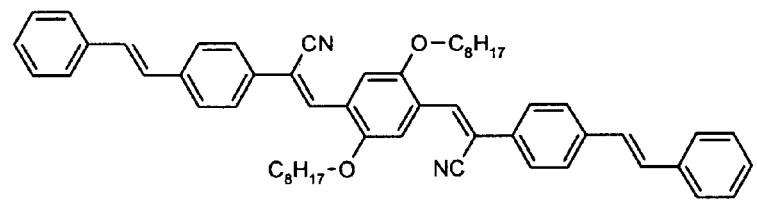
Figure 3E:
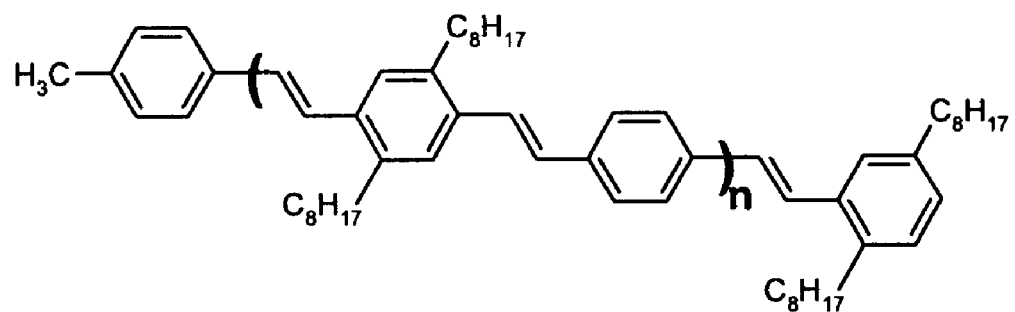
Figure 3F:
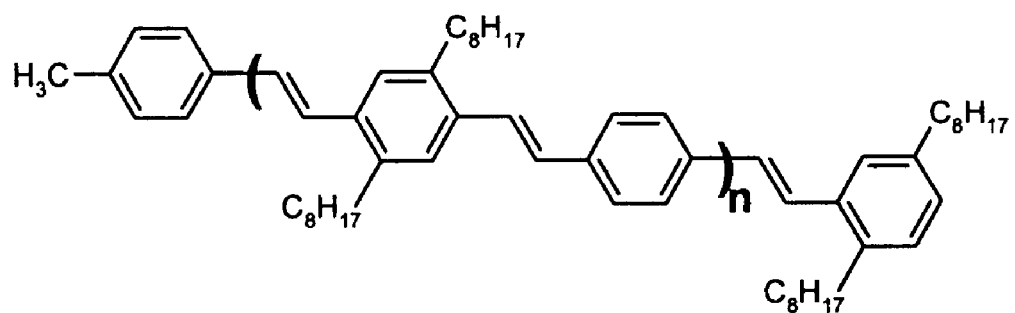

Yet another approach is to modify the structure of the oligo(phenylene vinylene) to obtain the desired bandgap for the electroluminescence in the infrared (see, e.g., chemical structures in FIGS. 3A–F). A 10-OPV as shown in FIG. 3F can be synthesized with added nitrile (CN) groups and electron donating groups. Photoluminescence can be used to monitor and determine the band-gap shift. The electron withdrawing and electron donating groups also give nonlinearity to the OPV segment which can be used for switching purposes. As an emissive layer, when forward biased, the material will electroluminesce. Conversely, when reverse biased, the material will exhibit optical nonlinearity which can be used for switching purposes. Therefore a waveguide can be fabricated with the desired length and terminated with active distributed Bragg reflectors on each end as adjustable reflectors (as depicted in FIG. 6).

Still yet another example is a dialkyl-amino-sulfone-stilbene-modified chromophore which is a good nonlinear optical material and also is strongly photoluminescent and electroluminesent (see, e.g., Yu et al., "Development of functionalized polyimides for second-order nonlinear optics", *ACS Symposium Series*, 601:171–180 (1995); PCT International Application WO 01/06305). Results of experiments shown in FIG. 10 confirm that this material is also a good electroluminescent material.

The polymeric materials that preferably are employed in the invention further are described below.

Polymeric Materials Employed in the Invention

The present invention is directed at employment of some of the vast inventory of available organic dyes and compounds as emissive layers. The advantages of the use of such materials are many. To recite but a few: (a) electro-pumping is possible, making use of the electroluminescence property of these polymers; (b) chemical tailoring is possible to optimize desired properties and even introduce multi-functionality such as electroluminescence and optical nonlinearity; and (c) processing and fabrication are simple and inexpensive.

Thus, there are a large number of organic molecules that can be employed in the novel devices of the invention. For instance, oligomers, polymers, and rare-earth complexes are available for emissions from blue to near infrared. Yamamoto and Hayashida give a concise overview on the available materials used in electroluminescence applications (Yamamoto et al., "π-conjugated polymers bearing electronic and optical functionalities. Preparation, properties and their applications", *Reactive and Functional polymers*, 37:1–17 (1988)). Such materials can, for simplicity, be categorized into three parts.

First, for visible emission, material can be used as shown in FIGS. 1A–H. These are well known compounds and polymers that are commercially available. The structure and spectral properties of certain of these dyes are presented in Table 1.

TABLE 1

Structure and Spectral Properties of Commercially-Available Dyes

| Dye | Source | Absorption (nm) | Laser Peak (nm) | Range (nm) |
| --- | --- | --- | --- | --- |
| IR5 | Lambda Physik | 800–1150 | 1320 | 1180–1400 |
| IR26 | Lambda Physik | 800–1150 | 1290 | 1200–1320 |
| PY-1 | Exiton | 900–1200 | 1400 | 1390–1490 |
| H$_2$Pc | | 500–800 | | 850–100 |

Second, for infrared emissions, a blend of PVK and H$_2$Pc as emissive hole transport and a layer of DCM as the electron transport layer on top of which a metal electrode will be deposited (see Fujii et al.) can be employed. Additionally, rare-earth chelates and complexes can be added to this category for lasing and emissions from these ions. Praseodymium and neodymium (e.g., as described in Pavier et al., "Electroluminescence from dysprosium- and neodymium-containing LB films", *Thin Solid Films*, 284–285:644–647 (1996) and Hong et al., "Electron-transport properties of rare-earth chelates in organic electroluminescent devices, *Synthetic Metals*, 91:271–273 (1997)) chelates and complexes can be employed for their emission in the 1.3 μm range. Erbium chelates (e.g., as described in Gillin et al., "Erbium(III) tris(8-hydroxyquinoline) (ErQ): A potential material for silicon compatible 1.5 μm emitter", *Applied Physics Letters*, 74:798–799 (1999)) for 1.5 μm emission line can be used.

Third, it is a well known fact that if a conjugated segment such as an oligo(phenylene vinylene) is chemically attached to an electron acceptor on one end and an electron donor on the other (e.g., as depicted generically in Structure I, below), the result will be a nonlinear optical chromophore (Dalton et al., "Polymeric electro-optic modulators: Materials synthesis and processing", *Adv. Mater.*, 7:519–541 (1995)).

Structure I

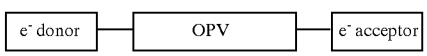

In addition to being electroluminescent, such materials will bear other functionalities such as waveguiding and optical nonlinearity. Such materials will reduce the fabrication steps and can pack the devices described herein (e.g., an amplifier, an electro-optic modulator, and a tunable laser source) as well as other electrooptic devices (e.g., a multifunctional optical switch such as described in PCT WO 01/06305) wavelength division multiplexer (WDM) all on the same waveguide.

Thus, among the more recently developed compounds that can be employed in the invention are certain types of oligomer, for instance oligo(phenylene vinylene) (e.g., as described in Goodson et al., "Oligo(phenylene vinylene) for light-emitting diodes", *Adv. Mater.*, 9:639–642 (1997) and in Van Hutten et al., *Acct. Chem. Res.*, 23:257–265(1999))(see FIGS. 3A–F). The modified oligo(phenylene vinylene) have electroluminescent emissions shifted into the IR (see, e.g., FIG. 3, and its figure legend). Namely, the 5 OPV structures depicted in FIGS. 3A–D have electroluminescent peaks of 460 nm, 490 nm, 510 nm, and 540 nm, respectively. The 6 OPV structure depicted in FIG. 3E has an electroluminescent peak of 560 nm. The 10 OPV structure depicted in FIG. 3F has an electroluminescent peak of 580 nm. These materials accordingly have great flexibility for modification. Of course, further electron donating and withdrawing groups (as previously described) can be used for modification of the OPV backbone using synthetic methods well known in the art. (e.g., Goodson et al., supra; Van Hutlen et al., supra)

Preferably the 2°-NLO polymers employed in the invention (or other appropriate polymer) exhibit thermal and mechanical stability, and high optical non-linearity. Desirably the 2°-NLO does not suffer thermal decomposition until above about 300° C. Optimally the 2°-NLO has a large electro-optic coefficient ($r_{33}$) ranging anywhere from between about 5 to about 40 picometer/volt (e.g., as reported in the literature).

In terms of electroluminescence, the electroluminescence spectrum of organic compounds and polymers depends mainly on the conjugation band-gap of the conjugated material (Bradley et al., "Polymer light emission: control of properties through chemical structure and morphology" *Optical Materials*, 9:1–11 (1998)). The dominant charge carriers in these materials are holes. By injecting an electron into the conduction band, a hole-electron pair occurs which can combine and emit a photon, though the electron-hole pair's effective lifetime is very short lived. Due to the severe trapping in these materials the electrons get trapped before they get a chance to recombine. In the best device prepared to date, this recombination efficiency is less than 2 percent. Organic materials with conjugated structures that are also planar have semiconducting properties. The most common examples of such a material would be poly(phenylene vinylene), PPV, shown in FIG. 1, and its derivatives (e.g., the modified oligo (phenylene vinylenes) shown in FIGS. 3A–F).

The p orbitals of the carbon atoms interact to give rise to a molecular orbital (MO) that extends over the length of the polymer chain. The electrons occupying this MO are delocalized over the chain. Defects in the chain terminate this delocalization (Bredas et al., "Excited state electronic structure of conjugated Oligomers and Polymers: A quantum-chemical approach to optical phenomena", Acc. Chem. Res. 32: 267–276 (1999)). This π bonding between neighboring atoms gives rise to bonding (π) and antibonding (π*) energy levels which are commonly referred to as HOMO (Highest Occupied Molecular Orbital) for π bond and LUMO (Lowest Unoccupied Molecular Orbital) for π* bond (Sheats et al., "Organic electroluminescent devices", Science, 273: 884–888 (1996); Ettedui et al., "Near edge x-ray absorption, Fine-structure study of Poly(2,3-diphenylene vinylene) following the desorption of metal", ACS Symposium Series, 672: 408–409 (1997)). The magnitude of the π conjugation which is determined by the number of consecutively connected monomers (n) in an isolated system determines the energy separation of the band-gap. Small n values give rise to higher band gap energy, whereas increasing n values lower the band gap until a point beyond which band-gap energy will not change is reached, termed saturation.

It also is preferred according to the invention that the 2°-NLO polymer is a polyimide, i.e., having as a "polymer backbone" poly [N,N(1,4 phenylene)-4,4' (hexa fluoroisopropylidene) diphthalic imide] depicted as "Z" in Structure II below and hereafter referred to generally as "polyimide" (although "S" and "C" present in the polyimide may differ, and are further described below):

Structure II

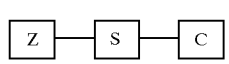

In Structure II, the preferred structure of the 2°-NLO polymer according to the invention, the polymer backbone is attached to a spacer, "S", which itself is attached to a chromophore "C", each of which is further described below. The polyimide according to the invention optionally can be modified or substituted if beneficial for a particular application, so long as such modification/substitution allows functionality within the spirit and scope of the invention. Alternately, instead of the chromophore being covalently attached to the polymer backbone, the chromophore desirably can be non-attached and used to dope the polymer.

In situations where it is not necessary that the polymer backbone exhibit thermal stability above 300° C., the polymer backbone can comprise the following polymers (or other polymers) instead of polyimide, and which have the thermal glass transition values (° C.) indicated: Poly(methyl methacrylate), 114; Polystyrene, 100; Poly(p-hydroxystyrene), 150; Polycarbonate, 150; Polyester, 38–130; Polyurethane, 140; Poly(phenylene vinylene), 40; Polyquinoline, 175; Polyamide, 276; Polyimide, 310. Thus, desirably according to the invention, these other polymers can be employed instead of polyimide as the polymer backbone "Z".

In particular, however, preferably the polymer backbone "Z" is polyimide, i.e., having Structure III ($M_w$ of about 454) depicted below:

Structure III

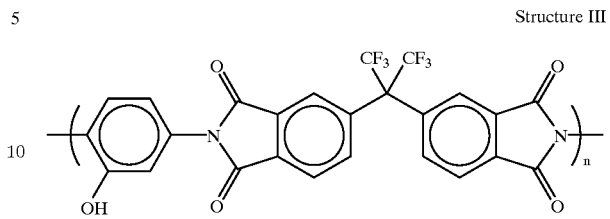

where n preferably is any number ranging from about 20 to about 600, and desirably ranges from about 100 to about 300. Generally it is found that longer chains (i.e., where n is greater than 20) give better properties in the sense that the chains intertangle better. Too great of a chain length, however, deleteriously impacts polymer solubility.

The spacer, "S", in Structure II preferably is a chain of from 0 to 30 carbons (or other moieties, including attached moieties, such as hydrogen, and functional groups including but not limited to alkyl groups) which provides optimal spacing such that the polymer backbone is appropriately attached to, and does not interfere with, the functionality of the chromophore ("C"). In particular, preferably the spacer has a length of from 1 to 10 atoms, and even more desirably, from 2 to 6 atoms. However, the spacer must be of sufficient length and character such that it does not interfere with the function of (e.g., the conjugation of) the attached chromophore, as well as does not interfere with the 2°-NLO or electroluminescent properties of the polymer. A preferred spacer according to the invention is oxytrimethylene spacer. Other preferred spacers are as described in PCT WO 01/06305.

With regard to the chromophore "C", this optimally is a stilbene, such as dialkyl-amino-sulfone-stilbene, or the stilbene oligomers depicted in FIGS. 3A–3F, that either is chemically attached or "doped" with polymer. For "doping" it is preferable that the concentration of the chromophore be between about 3% and about 10% of the total polymer mixture. Other variations such as would be obvious to one skilled in the art are contemplated by the invention. These polyimides (as well as other polyimides, or other polymers appropriate for optical applications) optimally can be modified by the incorporation of different chromophores into the polyimide backbone, allowing the responsiveness of the 2°-NLO polymer to different wavelengths of light to differ. Such modification of the polyimide backbone with different chromophores is known in the art, and is described, for instance, in Marder et al., Nature, 388, 845–851 (1997). The chromophore incorporated in the polyimide preferably can be any chromophore, but desirably is a chromophore that does not negate the 2°-NLO or electroluminescent properties of the resulting polymer.

Fabrication of the Novel Devices of the Invention

The methods of fabricating the novel devices of the invention desirably employ a number of novel photo-processes such as photobleaching techniques (FIG. 12) for writing gratings and waveguides (Keil, supra). These processes facilitate the fabrication by producing waveguides using lasers at the absorption wavelength of the 2°-NLO chromophores (e.g., typically between from about 300 nm to about 600 nm). The waveguides are unaffected by light with lowest wavelength outside the range of their absorption, such as at communication wavelengths of from about 1.3 to about 1.5 microns. Additionally, these processes reduce the costs dramatically and provide an easy way to fabricate integrated optical circuits.

With use of the preferred laser writing technique to prepare the devices according to the invention (e.g., see FIG. 12 and FIG. 13), desirably a holographic grating can be assembled with proper pitch to control the amount of out-coupled light with the appropriate fraction. Also, optionally the destruction of the chromophores by a well established photobleaching process (see, e.g., Rikken et al., "Poled polymers for frequency doubling of diode lasers" *Proc. SPIE*, vol 1337, pp 35 (1990)) using a photo-masking technique that causes a reduction of the chromophores in the material, can be employed to produce efficient waveguides in a preferred process according to the invention.

Gratings on waveguides for light coupling (including the Bragg-Grating discussed previously) have been studied for a number of years (Tamir, ed., "Topics in Applied Physics: Integrated optics", Springer Verlag, Vol. 7, page 92, (1979)), and coupling efficiencies of 80% or more have been achieved for passive couplers by the proper adjustment of waveguide layers and refractive index, n, and groove spacing of the grating, Λ. Making use of the second-order nonlinearity of the waveguides, the refractive index, n, across the grating can be changed by applying a field across the waveguide. This allows the coupling efficiency of the grating to be changed or adjusted. Such a device according to the invention provides an active grating-coupler that also can be employed as a light modulator, a light filter, or even a light valve.

In particular, the present invention desirably provides a methodology to fabricate "stacked" integrated optical circuits (i.e., circuits that are layered one on top of another instead of side-by-side, or in the same plane). Preferably such circuits are constructed using a unique laser-writing waveguide fabrication technique in accordance with the invention. A stacked device having two or more layers (especially having three layers) and which has independent waveguides and gratings in each layer is particularly preferred according to the invention. A variety of fabrication techniques can be employed to carry out construction of this device, e.g., optionally utilizing the photobleaching process or direct laser writing to fabricate the waveguide and the grating.

The fabrication of the devices of the invention desirably can be carried out in a series of steps, e.g., as described below.

(1) Determination of materials for and synthesis of the suitable material for the waveguide. The use of 2°-NLO polymers, as described herein, is preferred according to the invention, although other polymers also can be employed. The proper solvents and concentrations for each material for spin-coating uniform, thin, films on glass substrates needs to be addressed. Generally, however, appropriate coating can be obtained with use of a polymer having a concentration of at least about 300 g/l of N methyl pyrrole (NMP) or dimethylformamide (DMF). Similarly, for thick, uniform films, a high boiling point solvent is desirable. Typically according to the invention, the polymer is prepared e.g., in powder form. Subsequently the polymer is dissolved in a suitable solvent (e.g., NMP) and spin-coated on a surface, or adhered to the surface by any appropriate means known in the art. Procedures for precipitating the polymer as a powder, washing and drying the polymer, making a high concentration solution (e.g., in 1 to 2 ml of solvent) and spin coating (e.g., onto about a 1.5×1 inch surface, such as glass microscope slide) are known in the art (see, e.g., Saadeh et al., supra).

(2) Guided-wave structure design. A mathematical simulation of the guided wave conditions of different waveguide structures applied to 2°-NLO polymers desirably can be performed. Such simulation optionally takes into account the geometry and material properties (such as the difference in the refractive indices between core and cladding, etc.). For fabrication of complicated circuits, this step may be required. Any appropriate simulation program known and available in the art can be employed (e.g., the product BPM_CAD, Optiwave Corp., ON, Canada; the product Beam Prop, R Soft, Inc., NY, N.Y.; and the product Thor/Prometheus, BBV Software BV, The Netherlands)

(3) Obtaining or constructing a specialized apparatus (or modifying an existing apparatus) for waveguide fabrication and testing. As depicted in FIG. 13, a computer controlled precision X-Y stage apparatus is preferred for laser writing of waveguides, and subsequent testing of waveguides, although other means optionally can be employed. The apparatus desirably can be constructed using commercially available, programmable, high-precision X-Y translation tables, preferably having 0.1 micron tolerance and repeatability. Other components of the apparatus also are commercially available.

(4) Fabrication of waveguides using, for instance, laser writing and photobleaching techniques, e.g., as described in the examples. Also, the same techniques desirably can be employed to write surface-relief and photobleached gratings in the 2°-NLO polymers, and to measure the loss in the waveguide and diffraction efficiency of the fabricated gratings from outside and through the waveguide.

(5) Analysis of the performance of the waveguides and other components (e.g., to determine the effectiveness of the techniques) and examination of the gratings, e.g., desirably by Atomic Force Microscopy (AFM), or other appropriate means. Also, a determination can be made of the performance of the components fabricated with different methods such as photobleaching as compared with direct laser writing, to determine the optimal means for fabrication of the components for a particular application.

(6) Determining the lasing and tuning efficiency of the material in passive and active devices (or components of devices, such as gratings) according to the invention. Preferably determination of spontaneous, or stimulated emission can be done by observing the changes in the emission spectra. For instance, this is done by observing the band narrowing of the spectra in the case of the stimulated emission. This determination, of course, is done merely to optimize components for a particular application.

(7) Optimization of lasing and tuning efficiency. In the case where the lasing emissions for the organic material in the infrared are considered to be inefficient, this can be compensated for, for instance, by three different approaches. The first approach is to change the cavity parameters such as length or reflectivity of distributed Bragg reflectors or pumping. A second solution to this problem would be to use infrared emitting rare-earth complexes which exhibit efficient through-ligand energy transfer such as erbium(III)-tris (8-hydroxyquinoline) as discussed in Gillin et al., "Erbium (III) tris(8-hydroxyquinoline) (ErQ): A potential material for silicon compatible 1.5 µm emitter", *Applied Physics Letters*, 74: 798–799 (1999). A third solution is to synthesize oligomers of phenylenevinylenes that will emit in the infrared (e.g., see FIGS. 3A–F).

The invention will now be described with reference to the following Examples. The following Examples are by means of illustration, not limitation. Of course, variation of these Examples in the spirit and scope of the invention are contemplated herein.

EXAMPLE 1

Lasing Principles

This Example describes the theoretical basis of lasing as applied to the present invention.

For a laser consisting of an effective gain medium of length $L_{eff}$ and two reflectors R1 and R2 the threshold gain is given by:

$$g_{th} = \alpha_i + \left(\frac{1}{L_{eff}}\right)\ln\left(\frac{1}{R_1 R_2}\right)$$

where $g_{th}$ is the threshold gain, $\alpha_i$ is the internal loss and R1 and R2 are the reflectivities of the Bragg gratings (Gupta et al., "Low-threshold amplified spontaneous emission in blends of conjugated polymers", *Applied Physics Letters*, 73:3492–3494 (1998)). With high reflectivities of $R_1$ and $R_2$ (e.g., $R_1 R_2 = 0.98$), then the threshold gain, $g_{th}$, basically has to overcome the waveguide loss, $\alpha_i$. The reflectivities, $R_{1,2}$ and the effective length $L_{eff}$ for a cavity with distributed Bragg reflectors are given by:

$$R_{1,2} = \frac{-ik\sinh(\gamma L_{1,2})}{(\alpha_p + i\Delta\beta)\sinh(\gamma L_{1,2}) + \gamma\cosh(\gamma L_{1,2})}$$

$$L_{eff} = L_a\left(1 + \frac{L_2}{2L_a(\alpha_p L_1 + 1)} + \frac{1}{2L_a(\alpha_p + \sqrt{k^2 + \alpha_p^2})}\right)$$

(List et al., supra) Basically, $L_{1,2}$ are the length of the corresponding distributed reflector, $\alpha_p$ is the loss coefficient in the unpumped region, $\beta$ is the phase constant of the propagating mode, $L_a$ is the length of the active region, k is the coupling constant, and $\gamma$ is described by the following relation:

$$\gamma^2 = k^2 + (\alpha_p + i\Delta\beta)^2$$

A detailed analysis of the distributed Bragg reflector lasers is given by R. G. Hunsperger (Hunsperger, *Integrated Optics: Theorem and Technology*, Third Edition, page 101, Springer-Verlag, Chap. 1 (1991)).

In a guest-host system where the host is an electroeluminescent hole-conducting matrix, and the guest is a dye (e.g., such as one of the dyes listed in FIGS. 2A–H) or is a rare-earth complex, the energy transfer between the guest and the host occurs through the dipole—dipole interaction of the Dexter-Forster type (see, e.g., Gharavi, "Experimental studies of visible to ultra-violet upconversion in rare-earth doped crystals and glasses of low phonon frequency", *Dissertation*, Tulane University, Department of Chemistry, December 1993).

EXAMPLE 2

Exemplary Photo-Induced Birefringence Laser Writing in Waveguide Fabrication This Example describes the theoretical basis underlying waveguide design according to the invention employing photo-induced birefringence laser writing, and particularly describes the theoretical bases for this use. This is further described in PCT WO 01/06305, incorporated herein in its entirety for this teaching. Of course, this may not be the preferred method with use of certain stilbenes, and other methods known in the art similarly can be employed.

Polymer waveguides have been fabricated in a number of ways including by photolithography, and photo-crosslinking, among others. Photolithography is probably the most widely used because of the established techniques in the semiconductor industry. In the context of the present invention, photo-induced birefringence is employed to fabricate waveguides, optimally having the arrangement depicted in FIG. 11.

Figure 14:
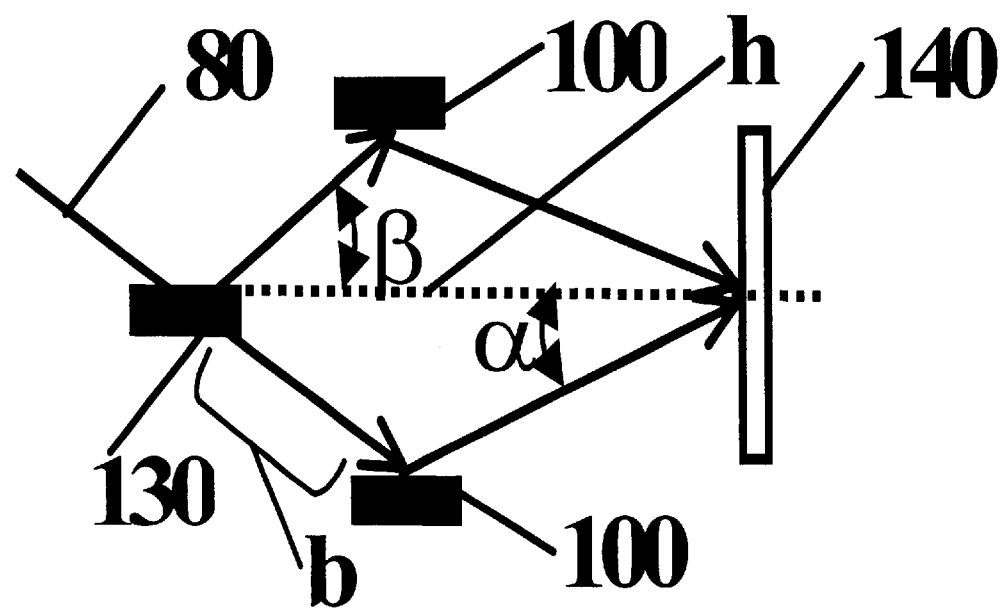
FIG. 14 depicts holographic grating formation using two overlapping laser beams which intersect at an angle $\alpha$ in the polymeric waveguide material. The relationship between angle of incidence in the laser beams ($\alpha$) and other geometrical parameters can be solved geometrically according to FIG. 14, where h is the distance between the beam splitter (130) and the sample (140), b is the distance between the mirror (100) and the beam splitter (130) and $\beta$ is the angle between b and h as shown in FIG. 14. Symbols: 80, laser beam; 100, mirror; 130, beam splitter; 140, polymeric material.

For the case in FIG. 14 where $n_1$ is very much less than $n_3$, e.g., $n_1$ is 1, and $n_3$ is 1.5 or greater (i.e., an asymmetric waveguide), the required refractive indices have the relationship in refractive index difference ($\Delta n$):

$$\Delta n = n_2 - n_3 \geq (2m_s + 1)^2 \lambda_0^2 / (32 n_2 t^2)$$

where t is the thickness of the waveguide, $\lambda_0$ is the vacuum wavelength and $m_s$ is the propagation mode, or guided wave mode) Hunsperger, "Integrated Optics: Theory and Technology", Third Edition, Springer-Verlag, New York. While $m_s = 0$ is preferred according to the invention (lowest mode), higher modes are possible depending on structure, with $m_s = x$, where x is any whole number from 1 to infinity, and desirably, is any whole number from 1 to 10, especially from 1 to 4. Therefore for an asymmetric 3 $\mu$m thick sample at 1.3 $\mu$m wavelength, $\Delta n = 0.003$ will suffice for single mode ($m_s = 0$) confinement. This condition can be satisfied by photo-induced birefringence laser writing (e.g., Rochon et al. (1992), supra; Kim et al., supra). Increasing the waveguide thickness requires an even smaller $\Delta n$ to satisfy the beam confinement condition.

Figure 11:
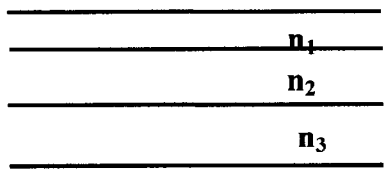
FIG. 11 is a diagram of a buffered waveguide and the corresponding differing refractive indices $n_1$, $n_2$, and $n_3$, that define each layer.

Thus, for an asymmetric waveguide as depicted in FIG. 11, desirably $n_1 < n_2$ and $n_3$ is $< n_2$. In FIG. 11, light is carried in the $n_2$ layer (i.e., the $n_2$ layer functions as the waveguide), for this to happen, the index of refraction $n_3$ and $n_1$ must be less than the index of refraction $n_2$.

For the case where $n_3 = n_1$ (i.e., a symmetric waveguide), for waveguiding of a given mode to occur, the following index condition must be satisfied:

$$\Delta n = (n_2 - n_1) \geq \frac{m_s^2 \lambda_0^2}{4t^2(n_2 + n_1)}$$

where t, $\lambda_0$ and $m_s$ are as previously described. This condition for $\Delta n$ in the case of a symmetric waveguide is easily satisfied by the smallest difference between $n_1$ and $n_2$, a difference which clearly lies within the laser-induced birefringence limits (Yu et al., "Highly Stable Copolyimides for Second Order Nonlinear Optics; *Macromolecules;* 29, pages 6139–6142 (1996); Gharavi et al., "Fine-Tuning Optical Nonlinearity and Thermal Stability in Functionalized Co-polyimides", (presentation), *American Physical Society Meeting*, March 18–22 (1996)).

The cut-off thickness $d_c$ for $TE_0$ and $TM_0$ are given by (Marcuse, "Theory of dielectric waveguides", *Academic*, New York, Chap. 1 (1974)):

$$d_{d,TE_o} = \frac{\lambda}{2\pi\sqrt{n_2^2 - n_3^2}} \arctan\left(\sqrt{\frac{n_3^2 - n_1^2}{n_2^2 - n_3^2}}\right) \text{ and}$$

$$d_{d,TM_o} = \frac{\lambda}{2\pi\sqrt{n_2^2 - n_3^2}} \arctan\left(\left(\frac{n_2^2}{n_1^2}\right)\sqrt{\frac{n_3^2 - n_1^2}{n_2^2 - n_3^2}}\right)$$

where $\lambda$ is the wavelength of the mode.

Accordingly, this Example provides the theoretical basis for use of photo-induced birefringence laser writing in construction of either an asymmetric or a symmetric waveguide according to the invention. The optical devices of the invention optionally can comprise an asymmetric and/or a symmetric waveguide.

EXAMPLE 3

Exemplary Direct Laser Writing in Waveguide Fabrication

This Example describes the use of direct laser writing in waveguide design according to the invention.

Direct laser writing of waveguides can be performed, for instance, using the apparatus depicted in FIG. 13. As shown in FIG. 13, the sample (10) comprising the particular polyimide(s) layered on a solid surface such as silica or glass is mounted on an X-Y stage (20) present on an optical table (30). The X-Y stage is employed to follow the path of the waveguide. A laser (70) is employed to create the beam (80), which is then focused on the sample with use of one or more lenses (90) and mirrors (100), and is monitored by way of a beam monitor (110). The X-Y stage is controlled with use of computer (120).

Direct writing has been shown (e.g., Wong et al., "Patterning of poly(3-alkylthiophene) thin films by direct-write ultraviolet laser lithography", *Materials Science Engineering*, B55:71–78 (1998)) to be an effective method to either write or inscribe thin polymer films. In particular, two wavelengths of a HeCd laser have been used to induce refractive index changes by the polarized light at 442 nm, or by bleaching the material using the 325 nm laser line. The resolution and repeatability of the X-Y stage (e.g., as depicted in FIG. 13) is 0.1 mm. Several computer programs in Basic programming and Visual Basic language were written to control the stage for writing waveguides and gratings. Therefore the width of the line written by the laser is dictated by the optics used.

Accordingly, this Example provides the use of direct laser writing in waveguide design according to the invention.

EXAMPLE 4

Holographic Crating Formation

This Example describes the formation of gratings in the polymer-based waveguides according to the invention by holographic means.

Gratings are formed by holographic means with use of two laser beams interfering at the 2°-NLO polymer. The period of the grating, $\Lambda$, is given by the following formula:

$$\Lambda = \frac{\lambda/n}{2\sin\alpha}$$

where $\alpha$ (depicted in FIG. 14) is the angle between the two intersecting beams, and n is the index of refraction of the material at the wavelength, $\lambda$ (Yariv, *Optical Electronics*, Forth Edition, Saunders College Publishing, page 548, (1991)). Therefore, with the proper choice of $\lambda$ and $\alpha$, a grating can be written in the polymer material.

If $\lambda$ is in the UV line of the HeCd laser at 325 nm, or such as in a nitrogen or excimer laser, the grating produced will be periodically bleached. If $\lambda$ is in the absorption range of the chromophore, surface relief gratings are produced. The distributed Bragg reflector (DBR) (passive or active) will consist of a bleached grating formed using two overlapping beams. The grating period, $\Lambda$, is adjusted so that the incident beam is reflected by the periodic perturbation of the grating. Gratings with periods of about 0.5 micron have been fabricated using the above technique in NLO polymer films. For the performance of one such grating, the period was measured by moving the grating formed against the interference pattern and measuring the intensity modulation of the diffracted light. The average period of the grating ($\Lambda$) was measured from a graph of this information to be 0.55 micron. Unevenness in the pattern was observed due to lack of resolution of the XY stage (about 0.1 micron).

Symbols are defined in FIG. 14 where h and $\beta$ are constants.

Thus, this Example describes the manner by which gratings can be formed in the polymer-based waveguides of the invention e.g., to allow for laser and/or amplifier production.

EXAMPLE 5

Exemplary Photobleaching in Waveguide Fabrication and Grating Formation

This Example describes the use of photobleaching in waveguide fabrication according to the invention. Such photobleaching has been successfully implemented for other polymer structures (Keil, supra; Rikken et al., "Poled Polymers for Frequency Doubling of Diode Lasers", *Proc. SPIE* 1337 (1990) 35).

Figure 12:
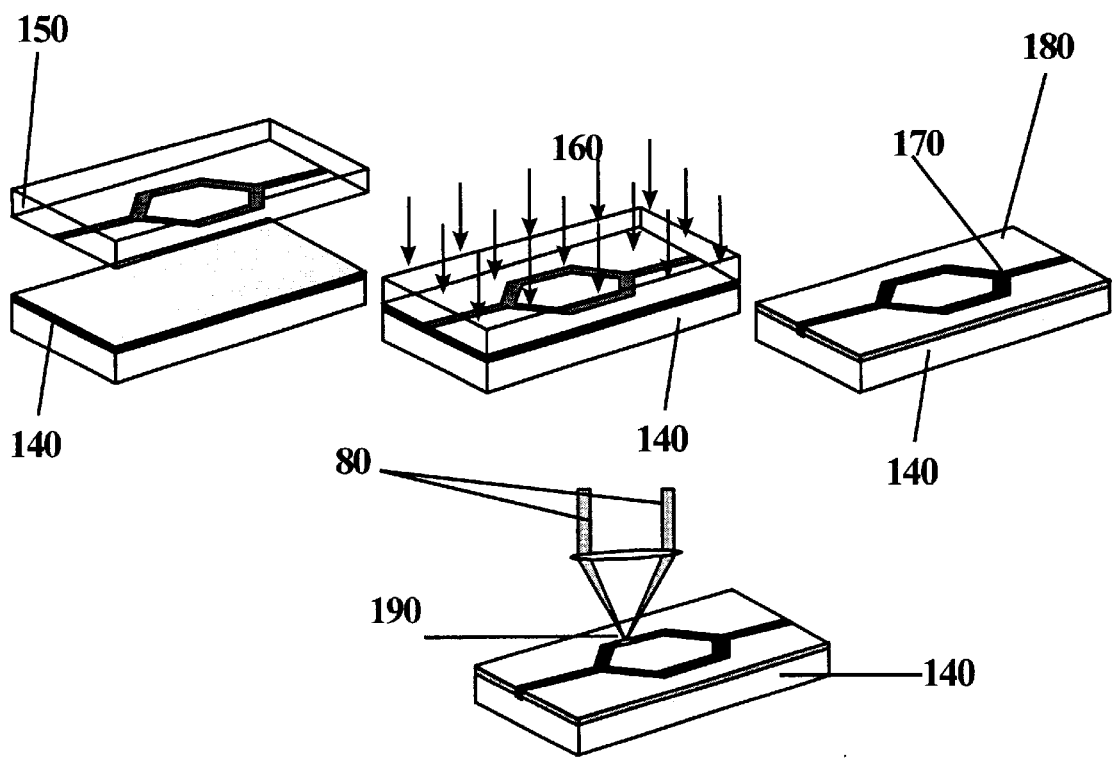
FIG. 12 shows photobleaching steps for waveguide fabrication and subsequent grating formation with use of laser beams. Symbols: 80, laser beam; 140, polymeric material; 150 metallic (e.g., quartz) mask; 160, irradiation; 170, unbleached waveguide; 180, bleached polymeric material; 190, grating formation.

This process of photobleaching is depicted in FIG. 12. Typically, a metallic mask (e.g., chromium coated quartz mask, (150)) is made by patterning the shape of the waveguide on a Cr-metal coated thin quartz slide using an etching technique, e.g., photolithography or excimer laser ablation. The mask also can be obtained commercially (Metrigraphics, Division of Dynamics Research Corporation, Wilmington, Mass. 01887). This mask is then placed on the surface of the polymer film (140), and irradiation (160) is carried out using ultraviolet light from a laser source such as a mercury lamp or a nitrogen or excimer laser. The waveguide is protected from UV radiation by the patterning on the mask, such that the chromophores are preserved in the region of the waveguide alone (170), and are destroyed outside the region of the waveguide (180). This causes a higher refractive index and thickness in the waveguide than in the UV-exposed regions of the polymer film (see, e.g., Ito et al., eds., *Polymeric Materials for Microelectronics Applications*, ACS Symposium Series 579 (Washington, DC: American Chemical Society, 1991); Lindsay et al., eds., *Polymers for Second Order Nonlinear Optics*, ACS Symposium Series 601 (Wash., DC: American Chemical Society, 1995), pp. 1, 111, 130, 158, 172, 374, 381). What results from this process is an unbleached waveguide (170), and bleached polymer (180) in the area surrounding the waveguide. In another step (e.g., described in Example 4 or 5) or other appropriate means, grating formation can be accomplished by creation of the grating using, for instance, a laser.

Accordingly, this Example provides the use of photobleaching in waveguide fabrication according to the invention.

EXAMPLE 6

Exemplary Stacking of Multiple Layers in Waveguide Fabrication

This Example describes waveguide fabrication according to the invention by the stacking of multiple polymer layers.

To stack multiple waveguide layers and gratings (such as are present in lasers and amplifiers), a device can be constructed one layer at a time. Fabrication can be carried out such that the fabrication of the top layer does not interfere with, or deleteriously effect, fabrication of the bottom layer, or other lower layers. Namely, the laser writing technique of FIG. 12 as applied in the present invention can be done in such a fashion so as to be completely non-interfering with layers other than the layer being written.

For instance, if the material is cis-trans active, a bottom layer can be constructed with a polymer having an absorption maximum at about 386 nm. The next layer could comprize a polymer having an absorption maximum at a longer wavelength. A third layer, or other layers (if present), could comprise a polymer exhibiting a different absorption maxima than the polymers present in the other layers. Use of the polymers in this fashion has the net result that the fabrication of layers in addition to a first layer will not interfere with, or destroy, the structure of the first (bottom) layer, or other lower layers.

Thus, this Example provides a method of waveguide fabrication by the stacking of multiple polymer layers. This is further described in PCT WO 01/06305. Alternately the layers could be separated by gold film layers in the case of the photo bleaching process.

EXAMPLE 7

Basic Grating-Coupler Theory in Waveguide Fabrication

This Example describes the theoretical basis of grating construction according to the invention, particularly in construction of a grating present in a laser or amplifier, or other device according to the invention.

Making use of the Pockels effect, the refractive index of the 2°-NLO polymers can be changed by an applied external field according to the formula:

$$\Delta n_{TE} = n_{TE}^3 r_{13} E/2 \text{ and } \Delta n_{TM} = n_{TM}^3 r_{33} E/2$$

where $r_{13}$ is the electrooptic tensor coefficient, E is the applied electric field, $n_{TE}$ is the refractive index of transverse electric wave, $\Delta n_{TE}$ is the change in medium refractive index of transverse electric wave due to the applied electric field, $n_{TM}$ is the refractive index of transverse magnetic wave, $\Delta n_{TM}$ is the change in medium refractive index of transverse magnetic wave due to the applied electric field, and $r_{33}$ is the electrooptic coefficient with the units of picometer/volt. (Levy et al., "Reflection Method for Electro-optical Coefficient Determination in Stratified Thin film structures", *Mol. Cryst. Liq. Cryst. Sci. Technol.—Sec. B: Nonlinear Optics*, 4, Pages 1–19 (1993); Reinisch et al., "Fast Pockels Light Modulator Using guided wave resonance", *Applied Optics*, 24, 2001 (1985)). The Bragg wavelength is given by:

$$\lambda_B = 2\Lambda n \text{ and } \Delta\lambda_B = 2\Lambda\Delta n$$

(assuming grating period, $\Lambda$, constant). Therefore as n shifts, so does $\lambda_B$. Of course the higher the second-order nonlinearity, the larger the shift in $\lambda_B$.

If the grating is designed for resonance coupling for the wavelength $\lambda$ and angle $\theta$ then a small bias across the grating will shift the resonance enough so that the central wavelength of the grating will shift. If the grating is designed so that the coupling is slightly off resonance, a small bias across the grating will change the index of the 2°-NLO waveguide to "tune in" to the resonance condition for wavelength $\lambda$. This configuration, therefore, can act like a modulator, a filter, or a reflector. At the same time, intercoupling of the individual lasers will be possible by selection of the appropriate grating pitch such that interlayer coupling occurs, e.g., as described for the optical switch in PCT WO 01/06305.

This Example thus provides an illustration of a variety of coupling methods that advantageously can be employed in the invention.

All the references cited herein are hereby incorporated in their entireties by reference, as are, in particular, PCT International Applications WO 01/06305 and WO 01/06240.

While the present invention has been described in terms of specific embodiments, it is understood that variations and modifications will occur to those in the art, all of which are intended as aspects of the present invention. Accordingly, only such limitations as appear in the claims should be placed on the invention. Although the applicant(s) invented the full scope of the claims, the claims are not intended to encompass within their scope the prior art work of others. Therefore, in the event that statutory prior art within the scope of a claim is brought to the attention of the applicant(s) by a Patent Office or other entity or individual, the applicant(s) reserve the right to exercise amendment rights under applicable patent laws to redefine the subject matter of such a claim to specifically exclude such statutory prior art or obvious variations of prior art from the scope of such a claim. Variations of the invention defined by such amended claims also are intended as aspects of the invention. Accordingly, this invention includes all modifications encompassed within the spirit and scope of the invention.

What is claimed is:

1. An optical device comprising:
    (a) an emissive layer that includes a waveguide comprised of an electroluminescent material and at least two gratings;
    (b) a means for injecting electrons into said emissive layer; and
    (c) a means for injecting holes into said emissive layer.

2. An optical device comprising:
    (a) an emissive layer that includes a waveguide comprised of an electroluminescent material and at least two gratings;
    (b) a cathode positioned so as to inject electrons into said emissive layer upon application of a voltage to said cathode; and
    (c) a hole injecting electrode positioned so as to inject holes into said emissive layer upon application of a voltage to said hole injecting electrode.

3. The optical device according to claim 2, wherein said device further comprises an electron injecting layer positioned between said cathode and said emissive layer that promotes injection of electrons into said emissive layer upon application of a voltage to said cathode.

4. The optical device according to claim 2, wherein said device further comprises a hole injecting layer positioned between said hole injecting electrode and said emissive layer that promotes injection of holes into said emissive layer upon application of a voltage to said hole injecting electrode.

5. The optical device according to claim 2, wherein said device is an optical laser.

6. The optical device according to claim 2, wherein said device is an optical amplifier.

7. The optical device according to claim 2, wherein one of said gratings is tunable.

8. The optical device according to claim 2, wherein two of said gratings are tunable.

9. The optical device according to claim 2, wherein one of said gratings is comprised of an optical nonlinear second-order polymer.

10. The optical device according to claim 2, wherein two of said gratings are comprised of an optical nonlinear second-order polymer.

11. The optical device according to claim 2, wherein at least one of said gratings is comprised of an optical nonlinear second-order polymer that is the same as a polymer that comprises said waveguide present in said emissive layer.

12. The optical device according to claim 2, wherein at least one of said gratings is comprised of an optical nonlinear second-order polymer that is different than any polymer that comprises said waveguide present in said emissive layer.

13. The optical device according to claim 2, which further comprises one or more means for creating an electric field positioned so as to communicate said field to at least one of said gratings.

14. The optical device according to claim 2, which further comprises an anode positioned to communicate an electric field to at least one of said gratings.

15. The optical device according to claim 2, wherein said electroluminescent material comprising said waveguide is an optical nonlinear second-order polymer.

16. The optical device according to claim 2, wherein said emissive layer comprises a polymer having the structure

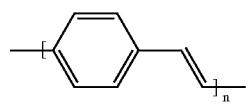

wherein ranges from about 6 to about 100,000.

17. The optical device according to claim 2, wherein said emissive layer comprises a compound, or a polymer comprising a compound, wherein the compound is selected from the group consisting of compounds having the structure

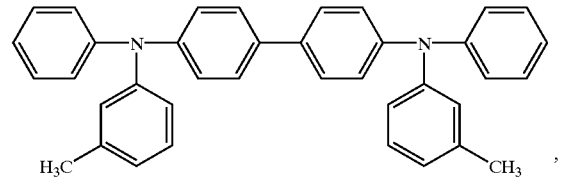

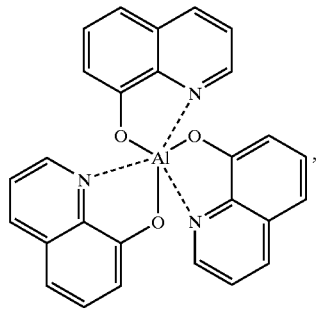

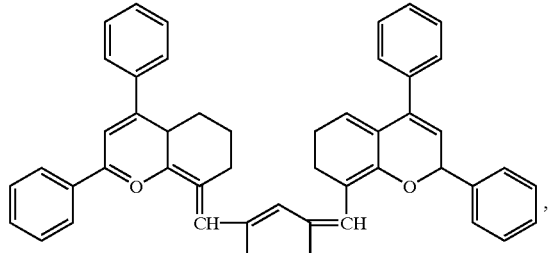

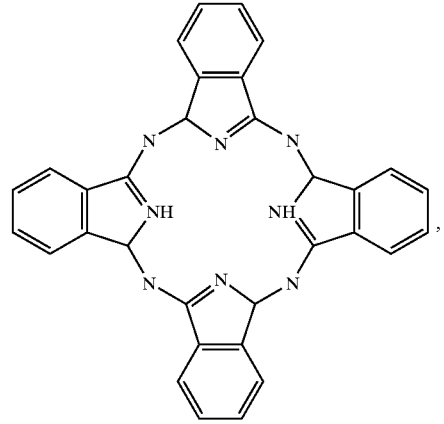

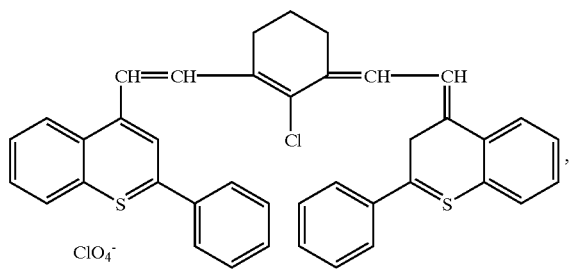

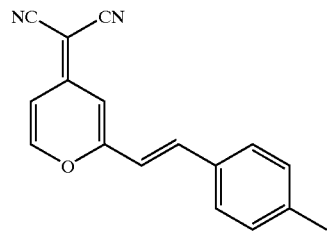

-continued
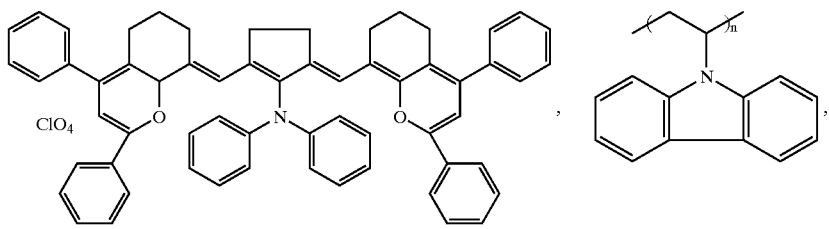
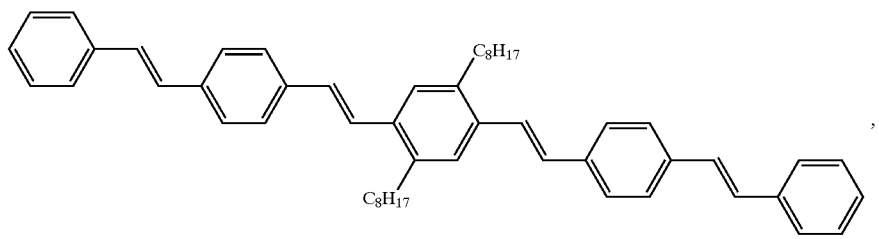
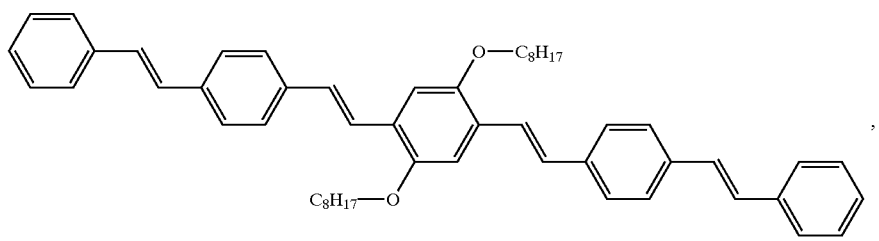
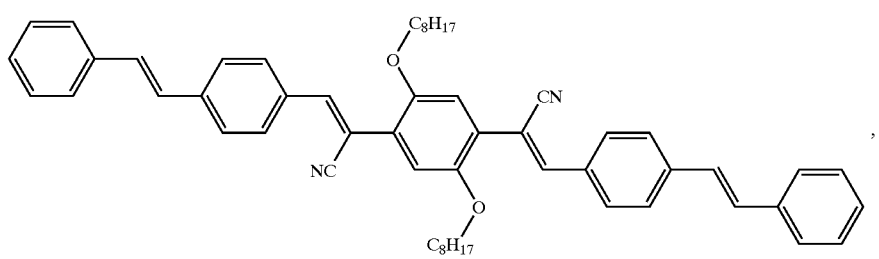
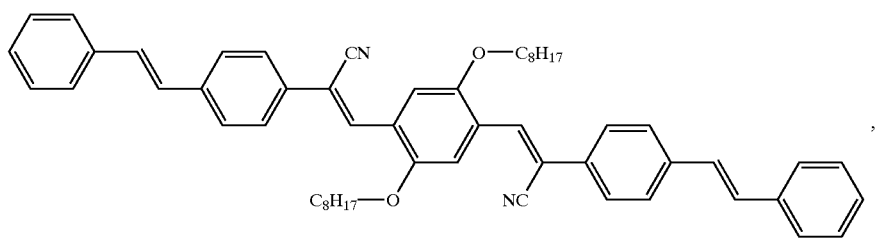
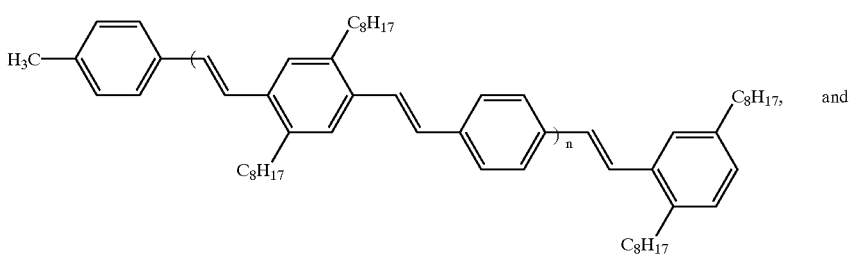
where n = 2

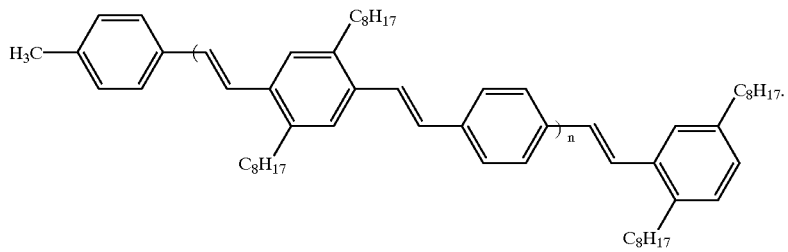

where n = 4

18. The optical device according to claim 15, wherein said optical nonlinear second-order polymer is selected from a polymer that:
   (a) is an optical nonlinear second-order polymer doped with a chromophore that is electroluminescent; and
   (b) is an electroluminescent polymer doped with a chromophore that exhibits optical nonlinear second-order properties.

19. The optical device according to claim 15, wherein said optical nonlinear second-order polymer has the structure

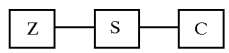

wherein Z is a polymer backbone, S is a spacer attached to Z, and C is an azo or a stilbene chromophore.

20. The optical device according to claim 19, wherein Z is

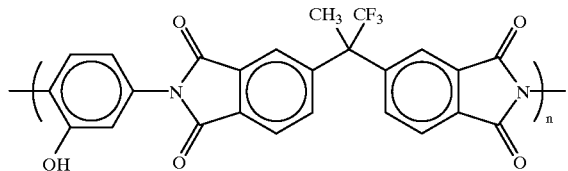

where n ranges from about 20 to about 600.

21. The optical device according to claim 19, wherein S is a carbon chain comprising from 0 to 30 atoms.

22. The optical device according to claim 19, wherein C is dialkyl-amino-sulfone-stilbene.

23. An optical device comprising:
   (a) an emissive layer that includes a waveguide comprised of an electroluminescent material and at least two gratings;
   (b) a cathode positioned so as to inject electrons into said emissive layer upon application of a voltage to said cathode;
   (c) an electron injecting layer positioned between said cathode and said emissive layer that promotes injection of electrons into said emissive layer upon application of a voltage to said cathode;
   (d) a hole injecting electrode positioned so as to inject holes into said emissive layer upon application of a voltage to said hole injecting electrode; and
   (e) a hole injecting layer positioned between said hole injecting electrode and said emissive layer that promotes injection of holes into said emissive layer upon application of a voltage to said hole injecting electrode.

* * * * *

UNITED STATES PATENT AND TRADEMARK OFFICE
CERTIFICATE OF CORRECTION

PATENT NO.     : 6,665,479 B2
DATED          : December 16, 2003
INVENTOR(S)    : Gharavi It is certified that error appears in the above-identified patent and that said Letters Patent is hereby corrected as shown below:

<u>Column 30,</u>
Line 17, please delete "wherein ranges" and insert -- where n ranges --.

Signed and Sealed this

Fifteenth Day of June, 2004

JON W. DUDAS
*Acting Director of the United States Patent and Trademark Office*